(12) United States Patent
Park et al.

(10) Patent No.: US 12,051,886 B2
(45) Date of Patent: Jul. 30, 2024

(54) SURFACE EMITTING LASER DEVICE, LIGHT-EMITTING DEVICE INCLUDING THE SAME AND MANUFACTURING METHOD THEREOF

(71) Applicant: SUZHOU LEKIN SEMICONDUCTOR CO., LTD., Taicang (CN)

(72) Inventors: Keun Uk Park, Seoul (KR); Yeo Jae Yoon, Seoul (KR)

(73) Assignee: SUZHOU LEKIN SEMICONDUCTOR CO., LTD., Taicang (CN)

(*) Notice: Subject to any disclaimer, the term of this patent is extended or adjusted under 35 U.S.C. 154(b) by 792 days.

(21) Appl. No.: 17/256,571

(22) PCT Filed: Jun. 28, 2019

(86) PCT No.: PCT/KR2019/007879
§ 371 (c)(1),
(2) Date: Dec. 28, 2020

(87) PCT Pub. No.: WO2020/005005
PCT Pub. Date: Jan. 2, 2020

(65) Prior Publication Data
US 2021/0273413 A1   Sep. 2, 2021

(30) Foreign Application Priority Data

Jun. 29, 2018 (KR) .................. 10-2018-0075866

(51) Int. Cl.
*H01S 5/183*  (2006.01)
*H01S 5/30*  (2006.01)

(52) U.S. Cl.
CPC ........ *H01S 5/18377* (2013.01); *H01S 5/3086* (2013.01)

(58) Field of Classification Search
CPC .................. H01S 2301/20; H01S 5/18338
(Continued)

(56) References Cited

U.S. PATENT DOCUMENTS 7,251,264 B2   7/2007   Johnson et al.
7,376,163 B2   5/2008   Amann
(Continued)

FOREIGN PATENT DOCUMENTS

JP         2564334 B2     12/1996
JP     2002-353568 A     12/2002
(Continued)

*Primary Examiner* — Tuan N Nguyen
(74) *Attorney, Agent, or Firm* — Birch, Stewart, Kolasch & Birch, LLP

(57) ABSTRACT

An embodiment relates to a surface-emitting laser element, a light-emitting device comprising same, and a method for manufacturing same. A surface-emitting laser element according to an embodiment may comprise: a substrate; a first reflective layer disposed on the substrate; an active layer disposed on the first reflective layer; an aperture region disposed on the active layer and including an aperture and an insulation region; and a second reflective layer disposed on the aperture region. The doping level of the aperture region may be $(X+3) \times XE18$ (atoms/cm$^3$) A ratio (b/a) of a second minimum diameter (b) to a first maximum diameter (a) of the aperture may be $[95.0-(2X/3)]\%$ to $[99.9-(X/3)]\%$, wherein X may be 0 to 3.

17 Claims, 20 Drawing Sheets

(58) Field of Classification Search
USPC .................................................... 372/38.05
See application file for complete search history.

(56) References Cited

U.S. PATENT DOCUMENTS

| | | | |
|---|---|---|---|
| 7,386,025 B2 | 6/2008 | Omori et al. | |
| 8,183,649 B2 | 5/2012 | Chua et al. | |
| 9,800,020 B2 | 10/2017 | Telkkäla et al. | |
| 2004/0081215 A1* | 4/2004 | Johnson | H01S 5/423 |
| | | | 372/96 |

FOREIGN PATENT DOCUMENTS

| | | |
|---|---|---|
| JP | 2004-47636 A | 2/2004 |
| JP | 2006-504281 A | 2/2006 |
| JP | 2006-514431 A | 4/2006 |
| JP | 2006-278572 A | 10/2006 |
| JP | 2006-294810 A | 10/2006 |
| JP | 2009-147347 A | 7/2009 |
| KR | 10-0475846 B1 | 3/2005 |
| KR | 10-2018-0026385 A | 3/2018 |

* cited by examiner

[FIG. 1a]
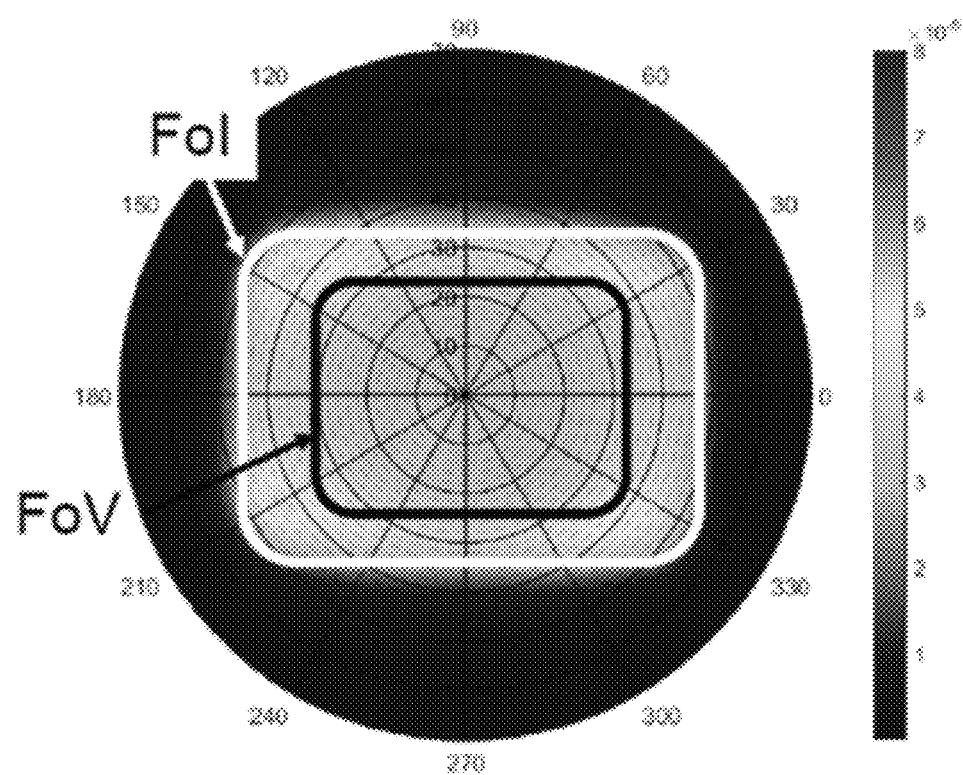

[FIG. 1b]
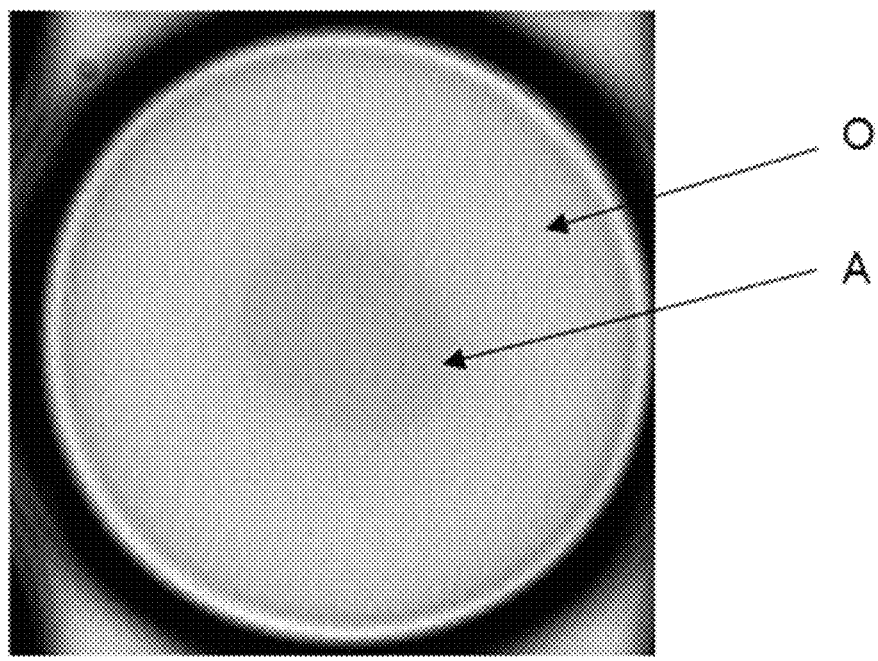
[FIG. 1c]
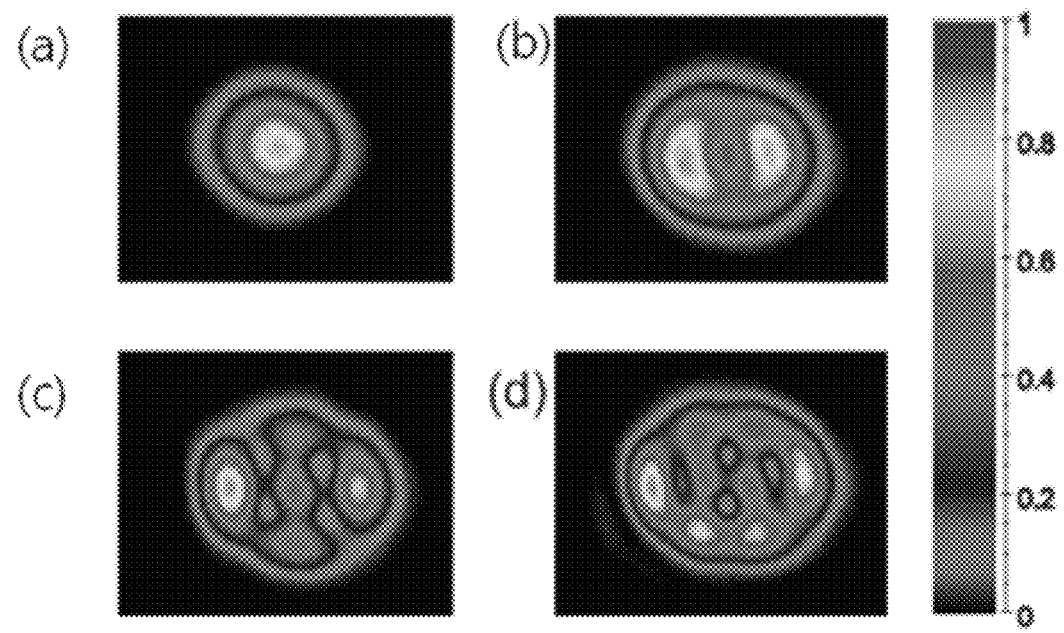

[FIG. 1d]
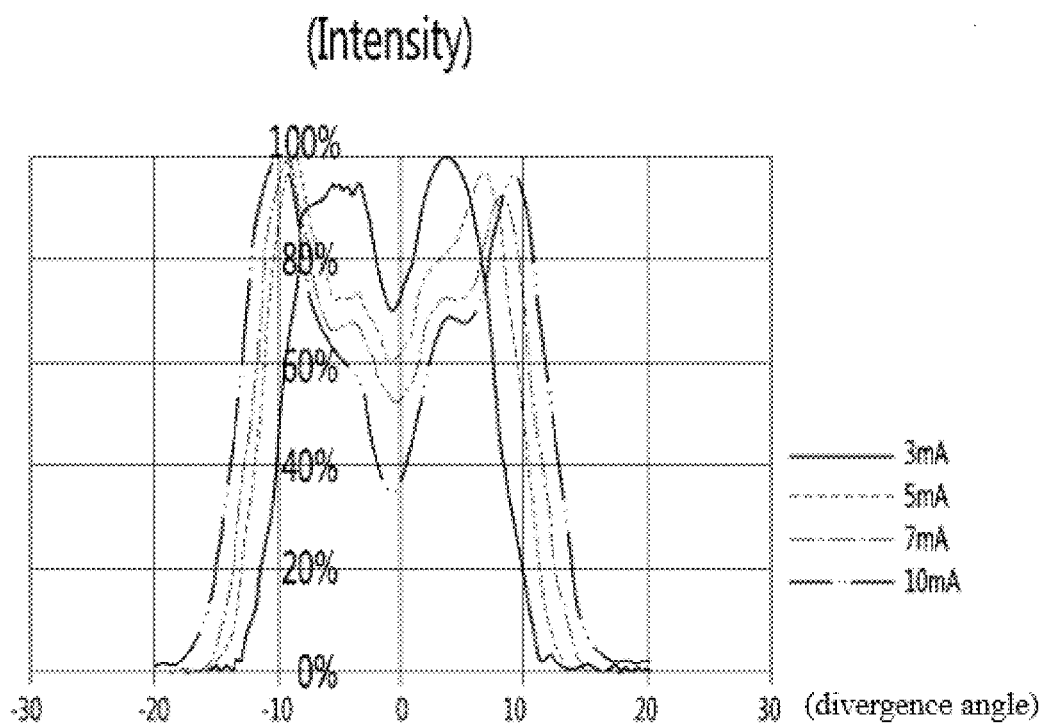
[FIG. 1e]
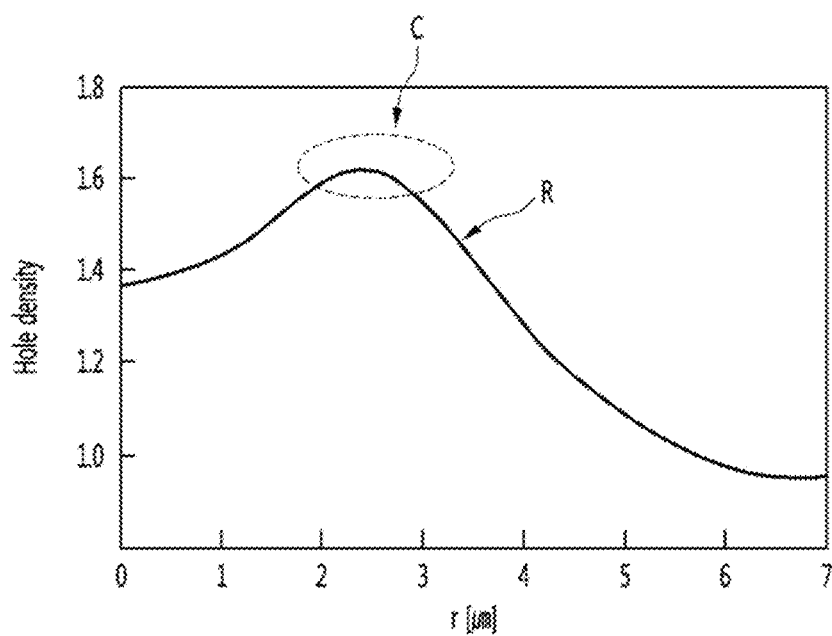

[FIG. 2a]
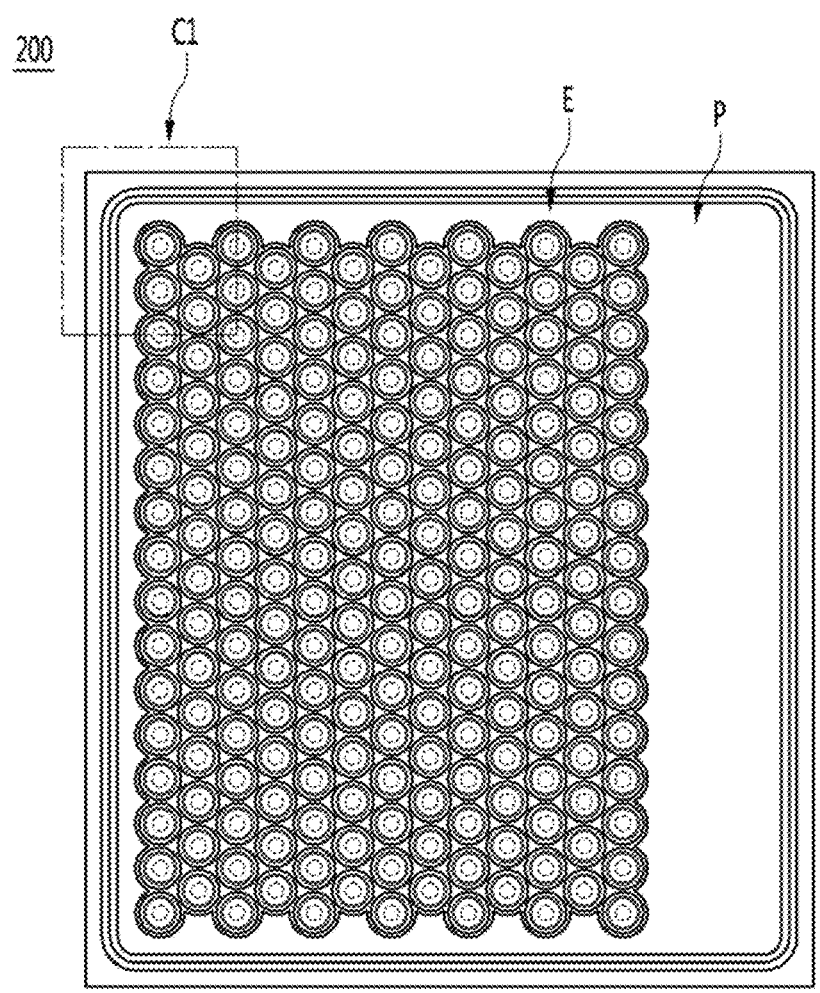

[FIG. 2b]
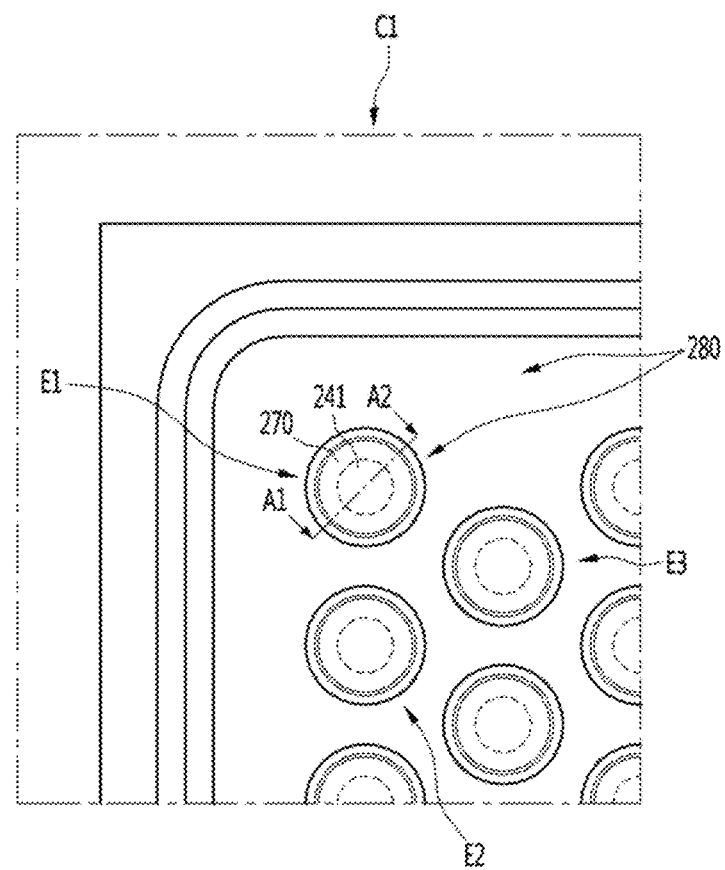

[FIG. 3a]
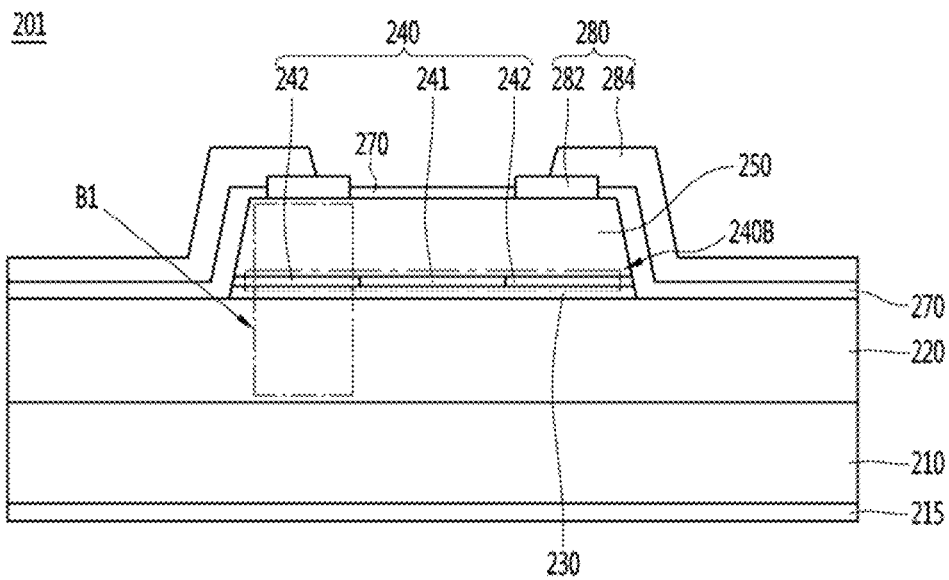
[FIG. 3b]
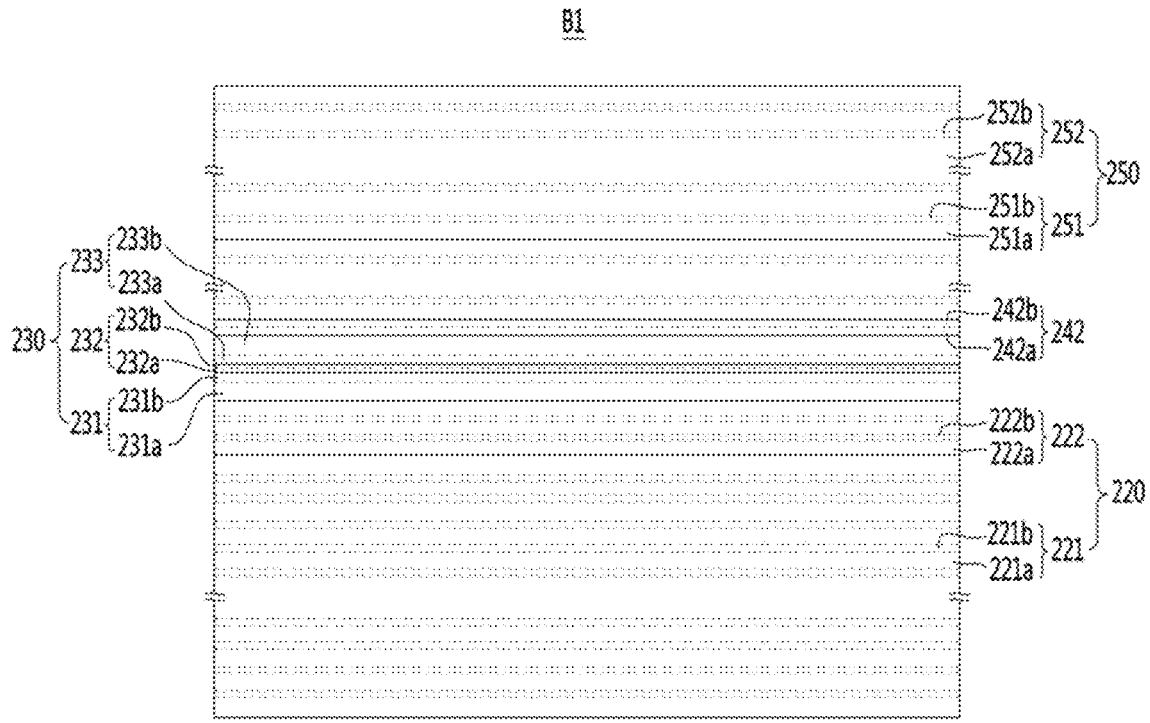

[FIG. 4a]
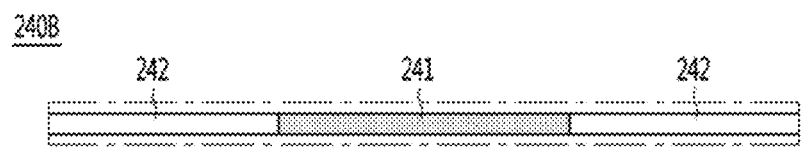
[FIG. 4b]
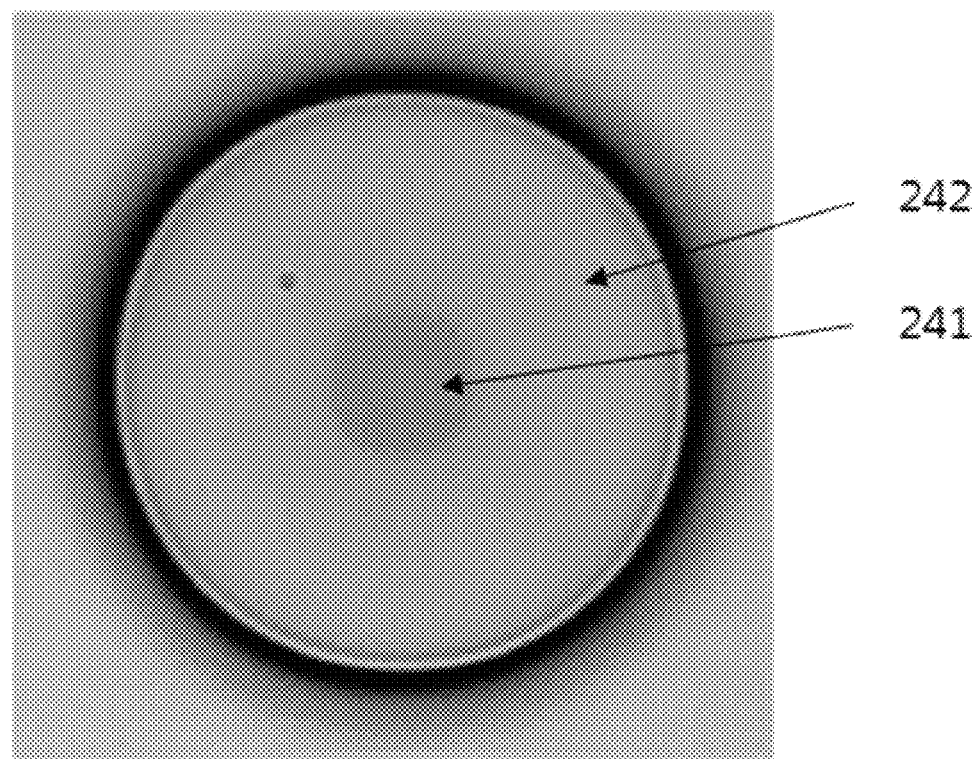

[FIG. 4c]
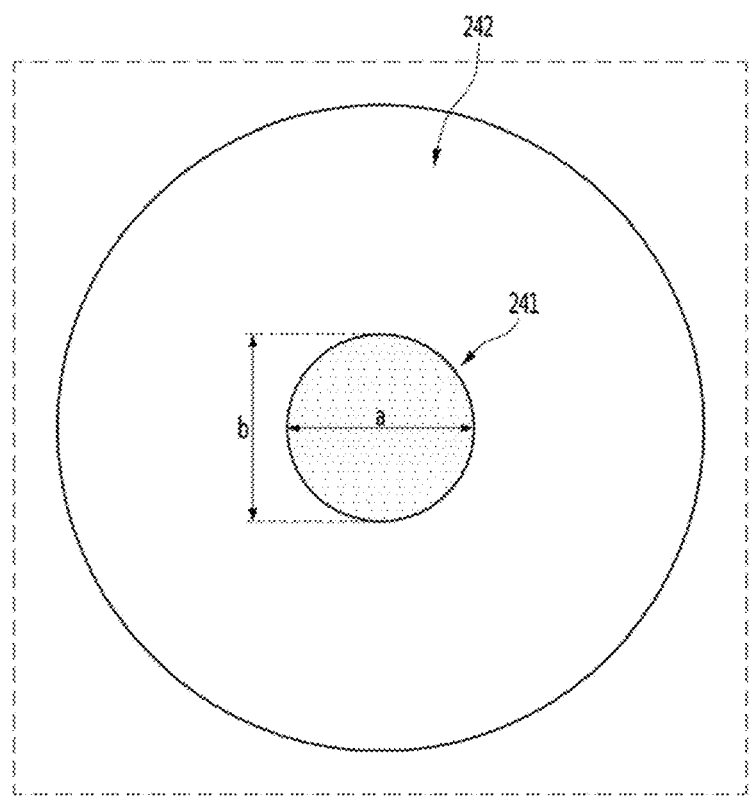

[FIG. 5a]
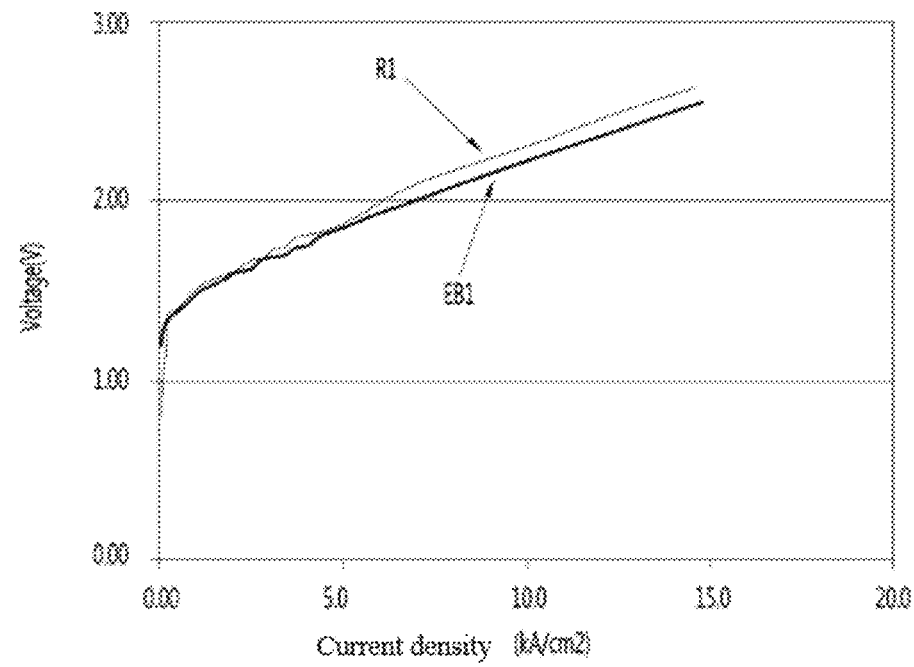
[FIG. 5b]
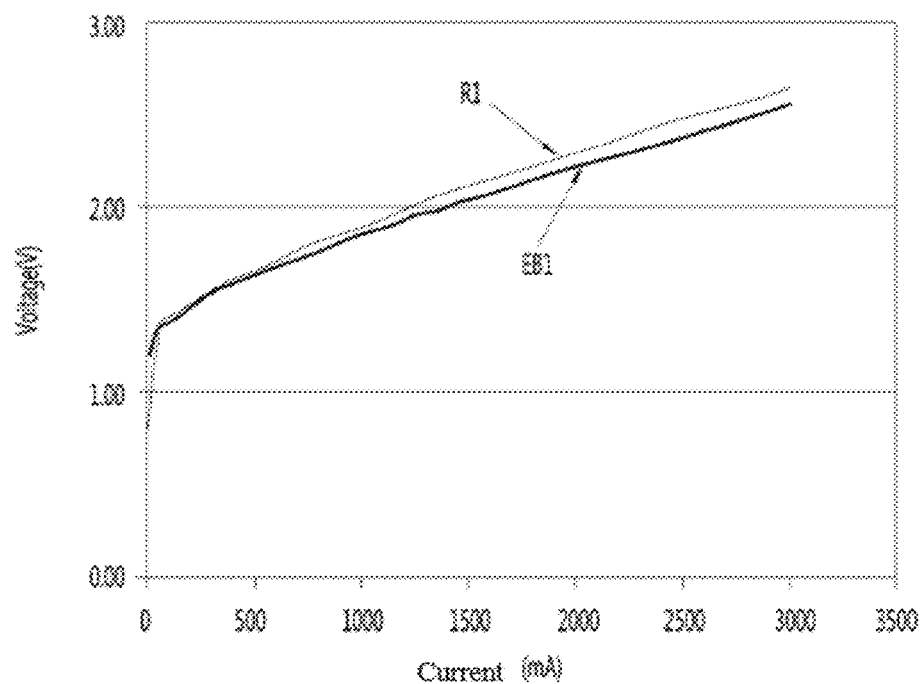

[FIG. 6]
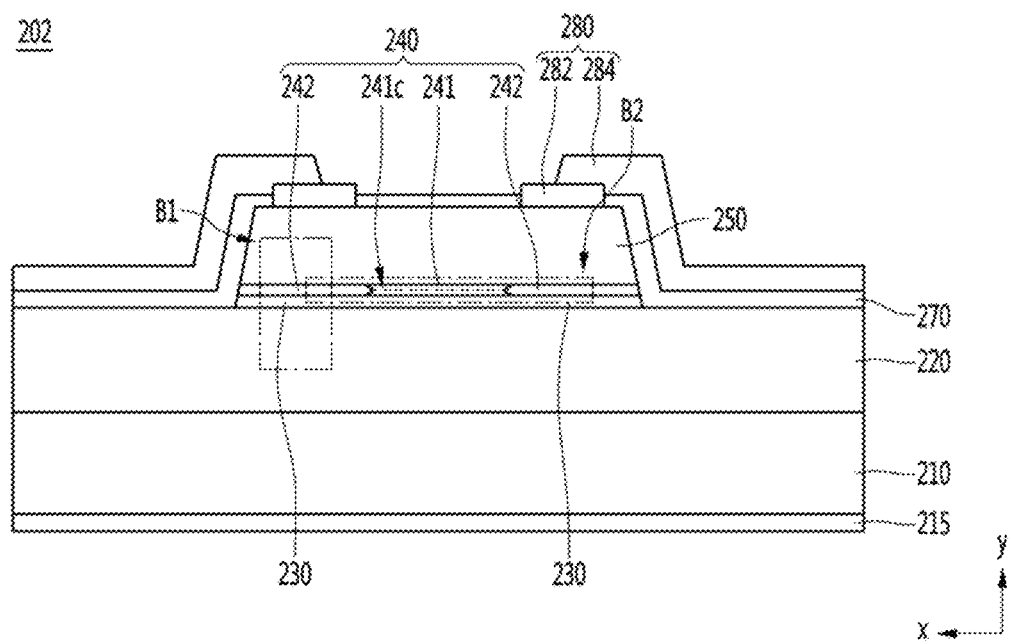
[FIG. 7]
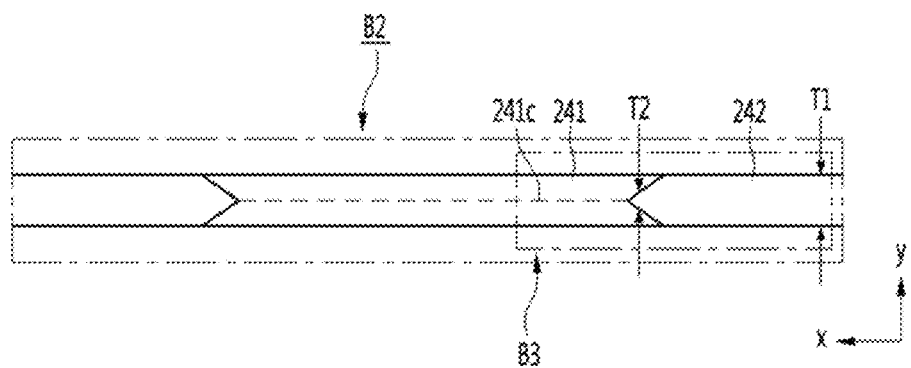

[FIG. 8]
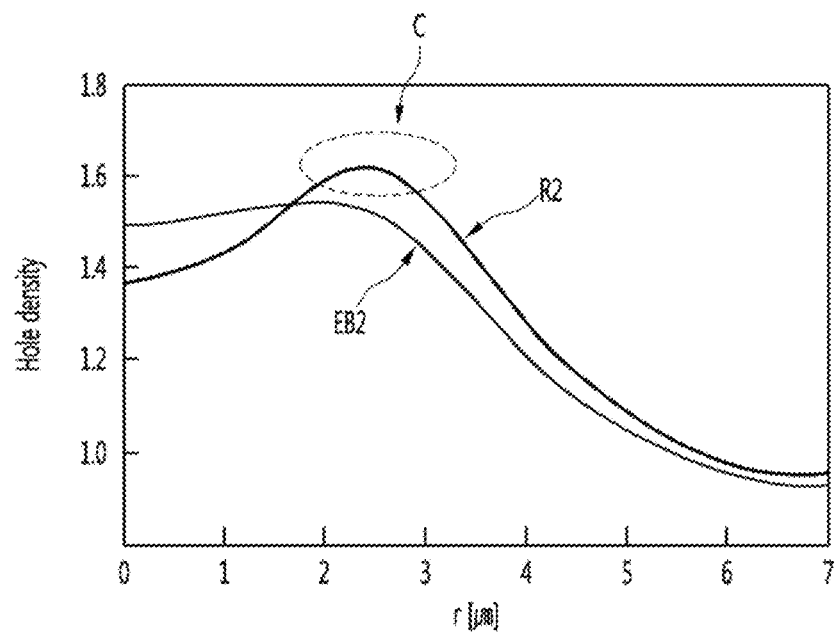
[FIG. 9]
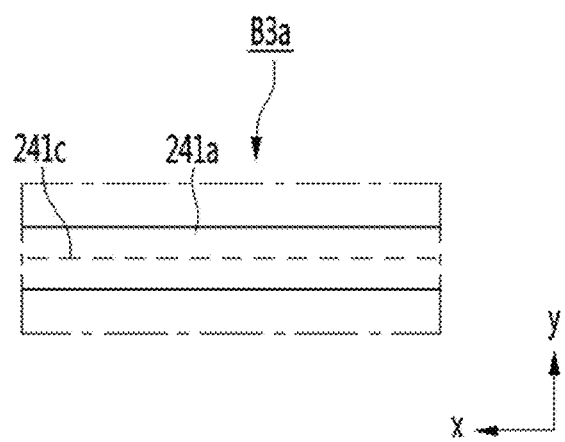

[FIG. 10]
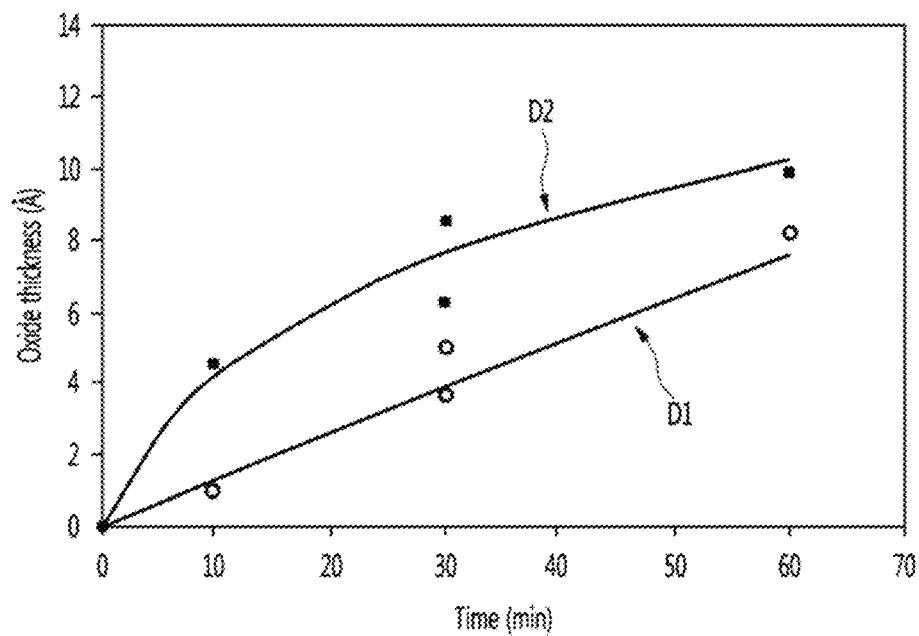
[FIG. 11]
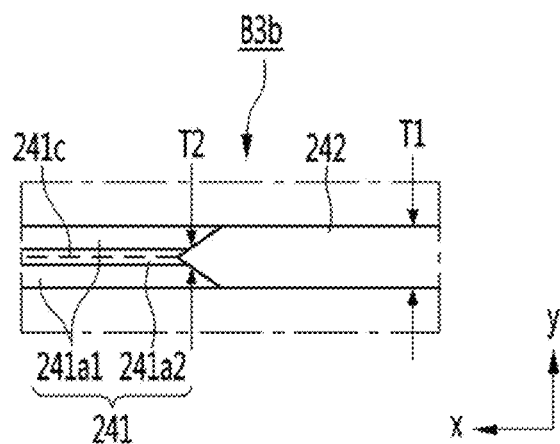

[FIG. 12]
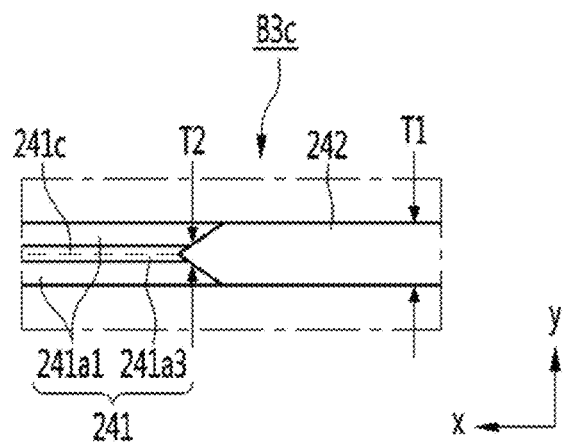
[FIG. 13]
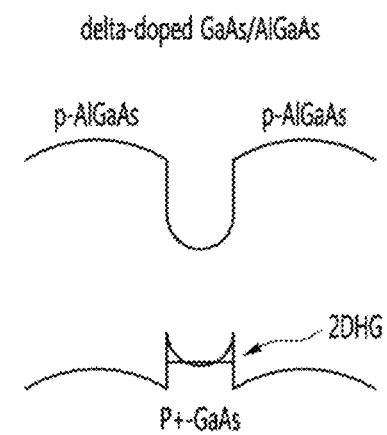

[FIG. 14a]
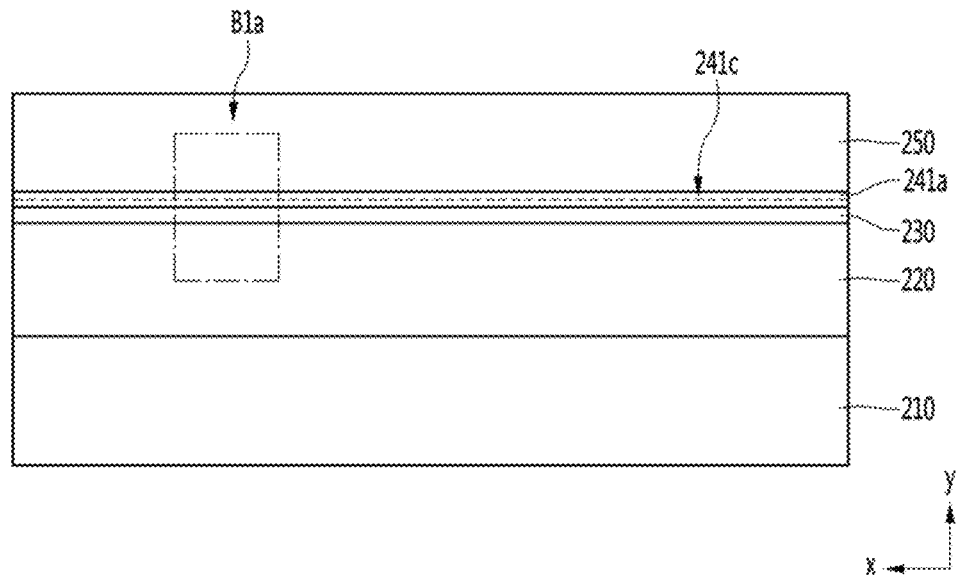
[FIG. 14b]
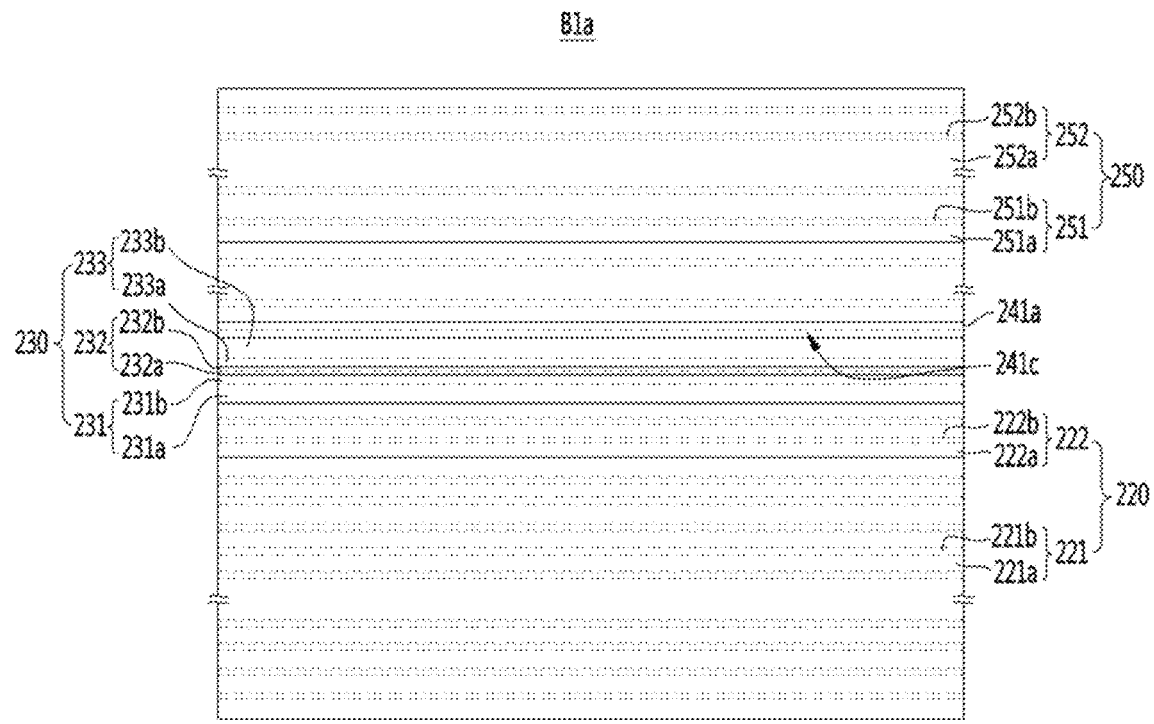

[FIG. 15]
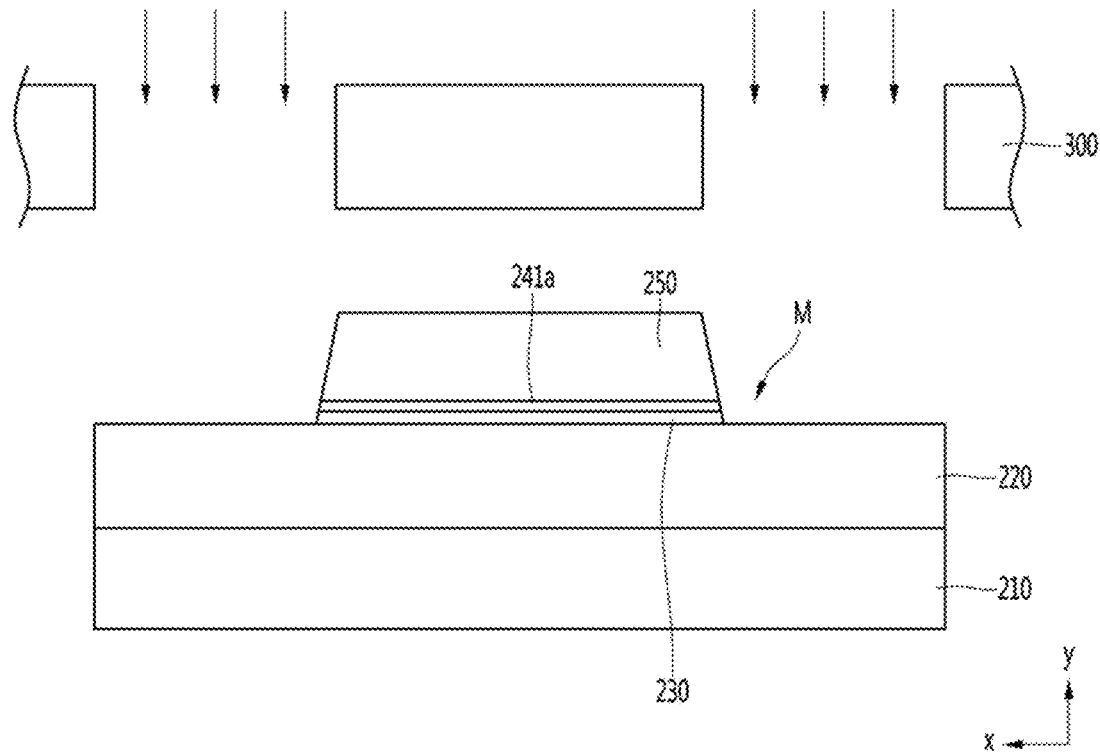
[FIG. 16]
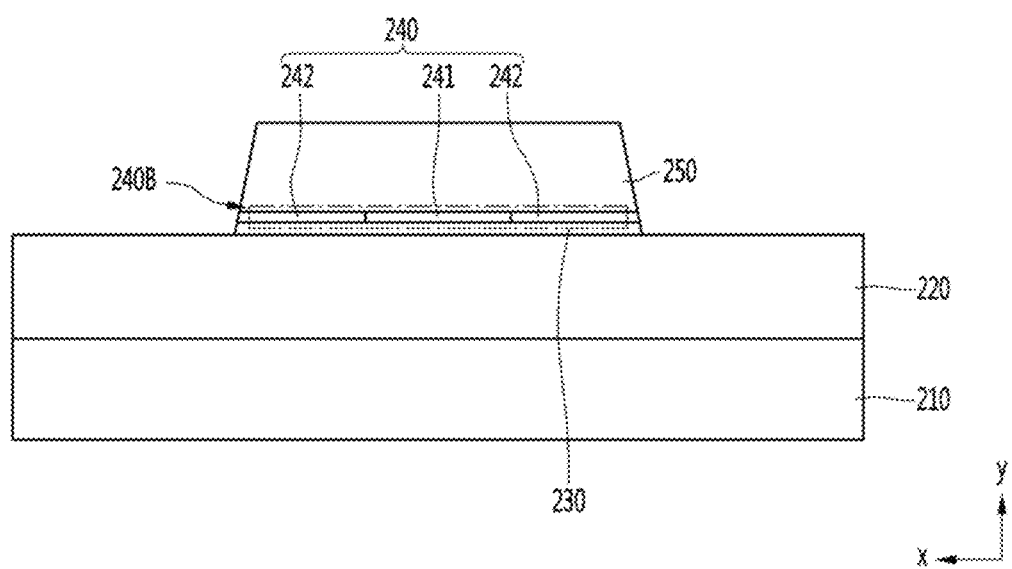

[FIG. 17]
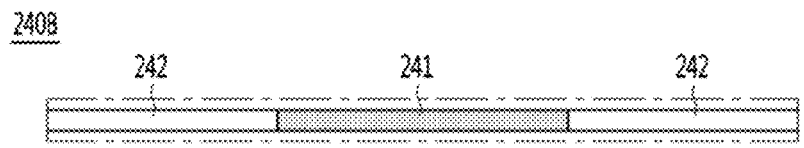
[FIG. 18a]
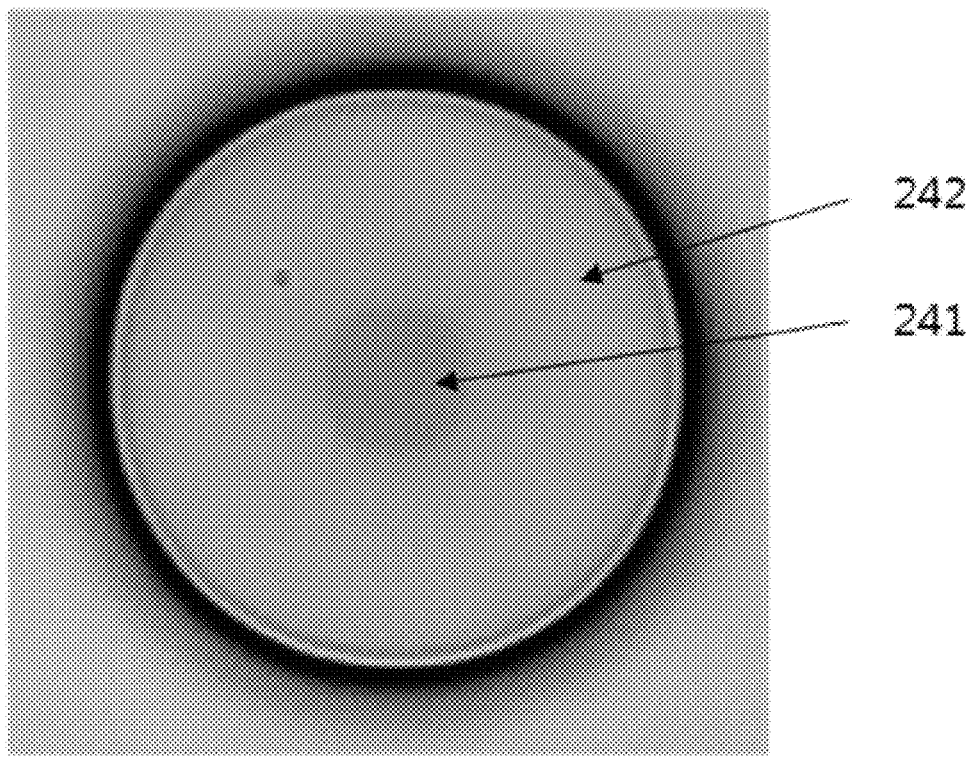

[FIG. 18b]
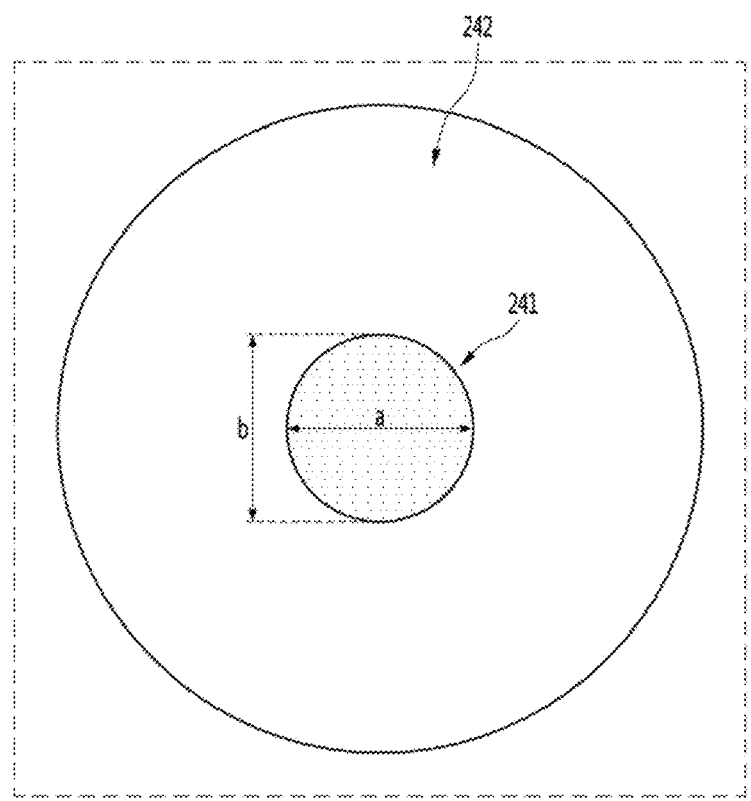

[FIG. 19a]
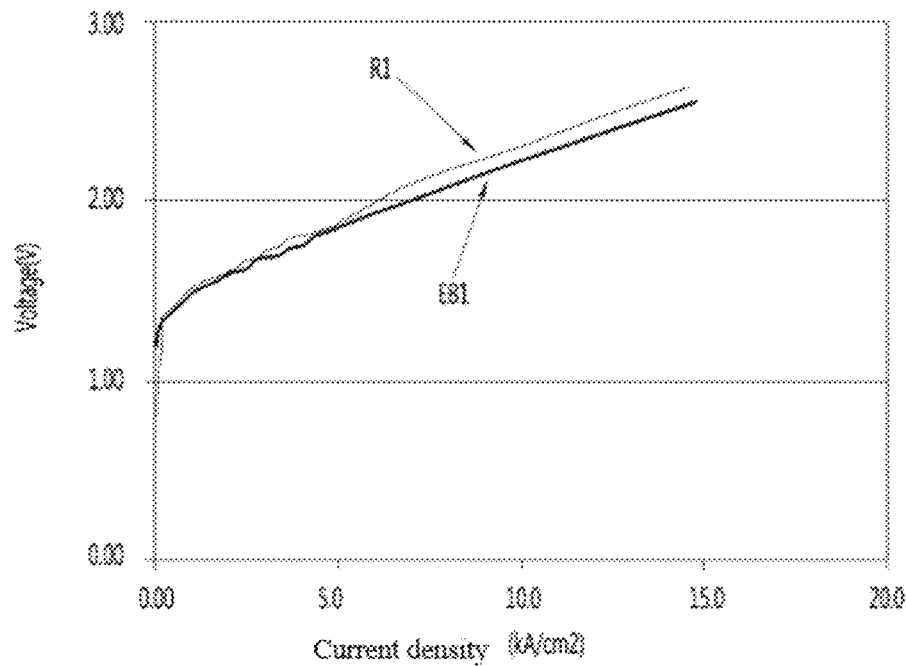
[FIG. 19b]
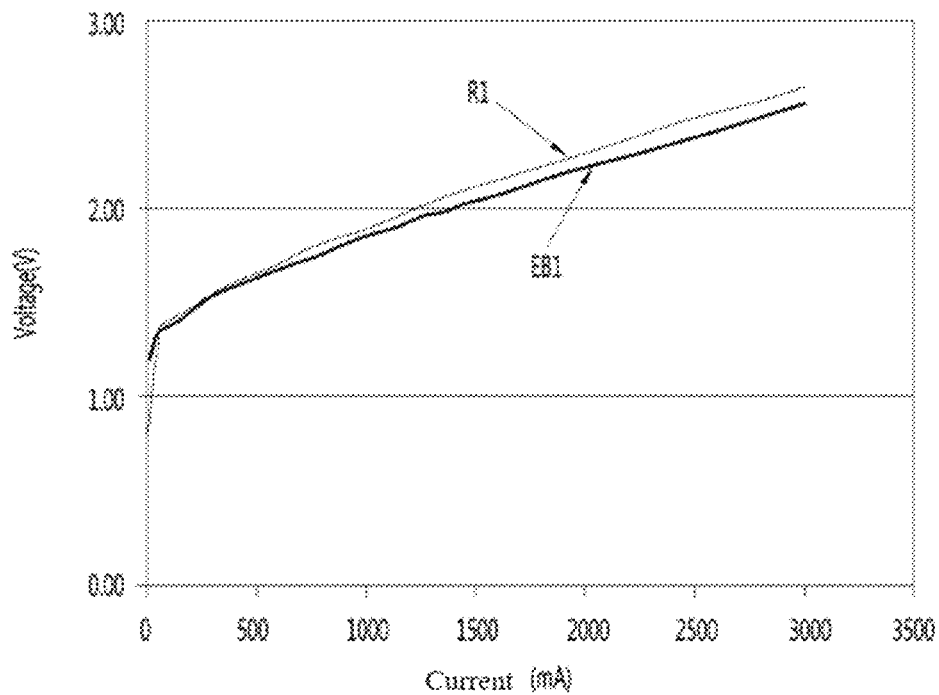

[FIG. 20]
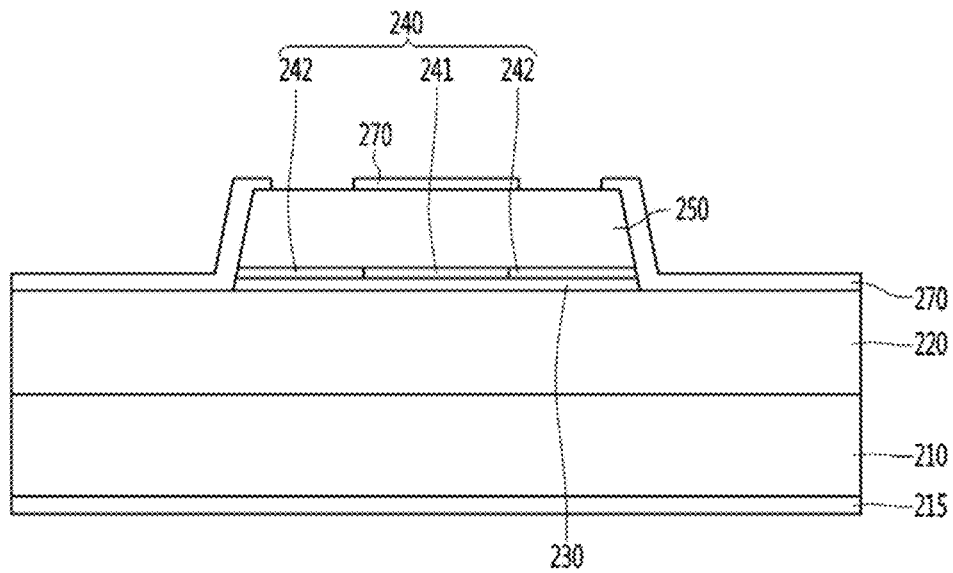
[FIG. 21]
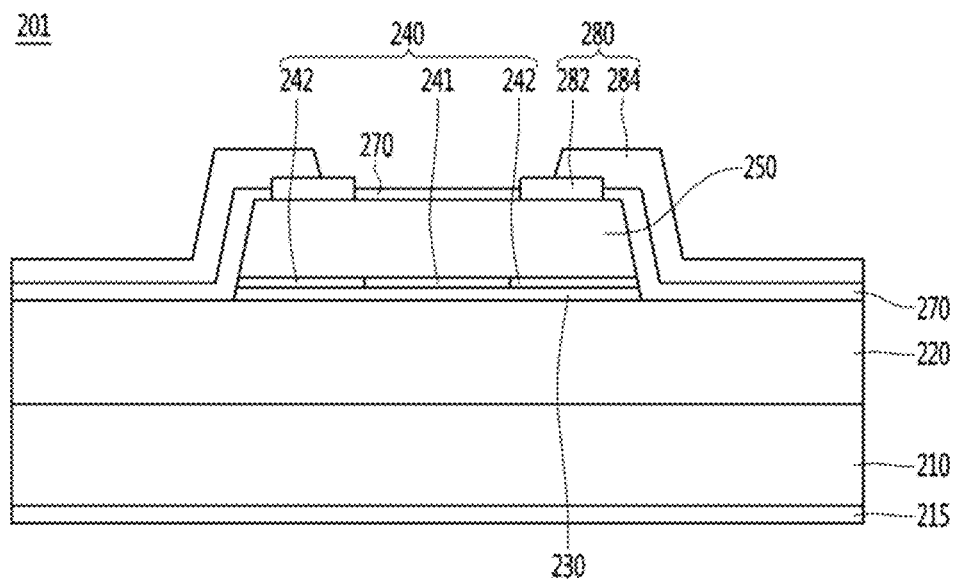

[FIG. 22]
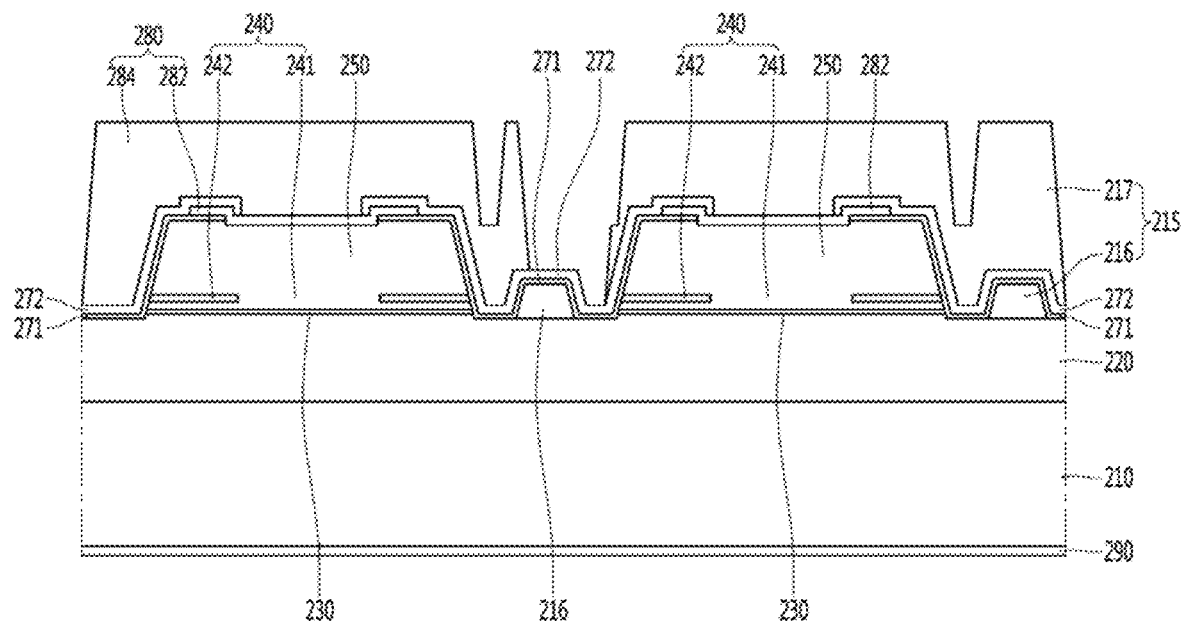
[FIG. 23]
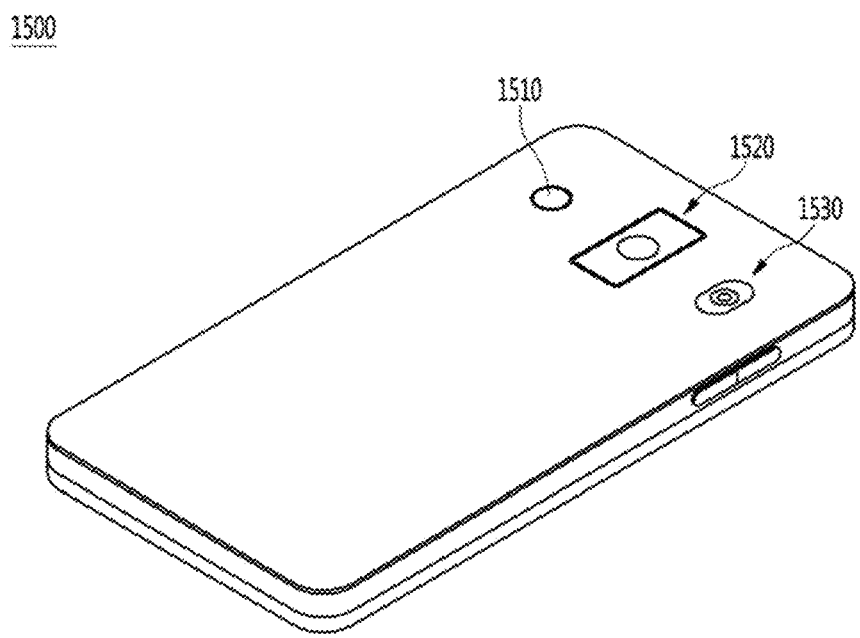

SURFACE EMITTING LASER DEVICE, LIGHT-EMITTING DEVICE INCLUDING THE SAME AND MANUFACTURING METHOD THEREOF

CROSS REFERENCE TO RELATED APPLICATIONS

This application is the National Phase of PCT International Application No. PCT/KR2019/007879, filed on Jun. 28, 2019, which claims priority under 35 U.S.C. 119(a) to Patent Application No. 10-2018-0075866, filed in the Republic of Korea on Jun. 29, 2018, all of which are hereby expressly incorporated by reference into the present application.

TECHNICAL FIELD

The present invention relates to a semiconductor device and, more specifically, to a surface emitting laser device, a light emitting device including the same, and a manufacturing method thereof

BACKGROUND ART

A semiconductor device including a compound such as GaN or AlGaN has many advantages, such as having a wide and easily adjustable band gap energy, and thus can be used in various ways as a light emitting device, a light receiving device, and various diodes.

In particular, light emitting devices such as light emitting diodes and laser diodes using a group III-V or II-VI compound semiconductor material of semiconductors can be implemented various colors such as blue, red, green, and ultraviolet light. In addition, it is possible to implement highly efficient white light rays by using fluorescent materials or by combining colors. In addition, it has advantages of low power consumption, semi-permanent life, fast response speed, safety and environmental friendliness compared to conventional light sources such as fluorescent lamps and incandescent lamps.

In addition, when light-receiving devices such as photodetectors and solar cells are also manufactured using compound semiconductor materials of Groups III-V or II-VI of semiconductors, the development of device materials generates photocurrent by absorbing light in various wavelength ranges. By doing so, light in various wavelength ranges from gamma rays to radio wavelength ranges can be used. In addition, it has the advantages of fast response speed, safety, environmental friendliness, and easy control of device materials, so it can be easily used for power control or ultra-high frequency circuits or communication modules.

Accordingly, a light-emitting diode backlight is replacing a cold cathode fluorescent lamp (CCFL) constituting a transmission module of an optical communication means and a backlight of a liquid crystal display (LCD) display device. Applications are expanding to white light-emitting diode lighting devices that can replace fluorescent or incandescent bulbs, automobile headlights and traffic lights, and sensors that detect gas or fire.

In addition, applications can be extended to high-frequency application circuits, other power control devices, and communication modules. For example, in the conventional semiconductor light source device technology, there is a vertical-cavity surface-emitting laser (VCSEL), which is used for optical communication, optical parallel processing, and optical connection. On the other hand, in the case of a laser diode used in such a communication module, it is designed to operate at a low current.

Meanwhile, response speed was important in the existing structure for data optical communication, but as it is recently applied to a high power PKG for a sensor, optical output and voltage efficiency become important characteristics.

For example, a 3D sensing camera is a camera capable of capturing depth information of an object, and has recently been in the spotlight in conjunction with augmented reality. On the other hand, for sensing the depth of the camera module, a separate sensor is mounted, and it is divided into two types: Structured Light (SL) method and Time of Flight (ToF) method.

In the structured light (SL) method, a laser of a specific pattern is radiated onto a subject, and the depth is calculated by analyzing the degree of deformation of the pattern according to the shape of the subject surface, and then combining it with a picture taken by an image sensor to obtain a 3D photographing result.

In contrast, the ToF method is a method in which a 3D photographing result is obtained by calculating the depth by measuring the time the laser is reflected off the subject and returning, and then combining it with the picture taken by the image sensor.

Accordingly, the SL method has an advantage in mass production in that the laser must be positioned very accurately, while the ToF technology relies on an improved image sensor, and it is possible to adopt either method or both methods in one mobile phone.

For example, a 3D camera called True Depth can be implemented in the front of a mobile phone in the SL method, and the ToF method can be applied in the rear.

Meanwhile, when a VCSEL is applied to a structured light sensor, a time of flight (ToF) sensor, or a laser diode autofocus (LDAF), it operates at a high current. Accordingly, problems such as a decrease in luminous intensity output or an increase in threshold current occur.

As described above, in the VCSEL package technology, the ToF method extracts Depth by calculating the time difference of the reflected pulse beam by the flash-type pulse projection through the VCSEL chip as a light source and the diffuser.

For example, FIG. 1A is an exemplary diagram of a method of determining a field of interest (FOI) and a field of view (FOV) by a combination of beam divergence and diffuser beam angle in a VCSEL chip. Accordingly, it is important to control the beam divergence in the VCSEL chip to determine the FOI and FOV.

Meanwhile, for high light output in the active layer of the VCSEL, an oxide aperture defining an aperture, which is a current injection hole, is required.

However, due to the optical characteristics of the VCSEL laser, the divergence angle of beams generated in the active layer region is changed by the aperture shape.

Accordingly, when the aperture shape is circular rather than non-circular, higher straightness can be obtained at the same amount of light, so that the divergence angle of beams can be controlled.

Meanwhile, FIG. 1B is an IR micrograph of an aperture shape in a VCSEL chip of a comparative example, and an aperture (A) may be defined by an oxide aperture (O).

In the related art, it is attempted to control the shape of the aperture (A) in a circular shape, but it is difficult to control, and there is a case where the shape of the aperture (A) becomes an ellipsoidal shape as shown in FIG. 1B.

However, when the shape of the aperture (A) is not circular, such as an oval shape, the divergence angle of beams is widened, resulting in a decrease in optical characteristics and light efficiency of the laser.

Next, FIG. 1C is a picture of a higher mode oscillation generated when a high current is applied in the related art, and FIG. 1D is data of a divergence angle of beams according to the applied current.

As shown in FIG. 1C, in the related art, when a low current is applied, a dominant mode is oscillated in an aperture that is a divergence region of the beam as shown in (a). However, as a high current is applied, a higher mode oscillates as shown in (b) to (d).

In addition, as shown in FIG. 1D, it can be seen that the divergence angle of beams increases as the applied current increases from 3 mA to 10 mA from low current to high current.

In addition, according to FIG. 1D, when a high current is applied, not only an increase in the divergence angle of the beam but also the overall intensity of the emitter region to be lasered is not uniform, and the luminous intensity at the aperture edge abnormally increases. There is a technical problem that the luminous intensity of the center is further lowered.

In particular, when the shape of the aperture is not circular, such as an ellipsoidal shape, the divergence angle of beams is increased more than the designed one, and becomes irregular, resulting in decreased optical characteristics and light efficiency.

Next, FIG. 1E shows carrier density, for example, hole density data according to the position of the aperture region in the related art (R). In FIG. 1E, the horizontal axis is the distance r from the aperture center to the aperture edge direction, and y axis is carrier according to the position, for example, hole density data.

According to FIG. 1E, current crowding (C) occurs in which the hole density at the aperture edge rapidly increases as a high current is applied from a low current, and the current crowding at the aperture edge occurs. As a result, a higher mode is oscillated, and there is a problem that the higher mode oscillation increases the divergence angle of beams.

In particular, when the shape of the aperture is not circular, such as an ellipsoidal shape, the difference in carrier injection path from the electrode that is disposed above the aperture to inject current to the aperture occurs. Accordingly, there is a problem in that the difference in carrier density, for example, hole density is further generated.

DISCLOSURE

Technical Problem

The embodiment is to provide a surface emitting laser device capable of controlling the divergence angle of beams by controlling the shape of an aperture and a light emitting device including the same.

In addition, the embodiment is to provide a surface emitting laser device capable of preventing current crowding at an aperture edge, and a light emitting device including the same.

Technical Solution

The surface emitting laser device according to the embodiment comprises a substrate, a first reflective layer disposed on the substrate, an active layer disposed on the first reflective layer, and an aperture region including an aperture and an insulating region disposed on the active layer, and a second reflective layer disposed on the aperture region.

The doping level of the aperture region may be $(X+3) \times E18$ (atoms/cm$^3$).

The ratio (b/a) of the second minimum diameter (b) to the first maximum diameter (a) of the aperture may be $[95.0-(2X/3)]\%$ to $[99.9-(X/3)]\%$. X may be 0 to 3.

A method of manufacturing a surface emitting laser device according to an embodiment includes forming a first reflective layer on a substrate, forming an active layer on the first reflective layer, forming an aperture region including an aperture and an insulating region on the active layer and forming a second reflective layer on the aperture region.

The first reflective layer, the active layer, and the aperture region may be grown in a predetermined off-angle state of the substrate.

The off-angle of the substrate may be $(X+0.5)°$.

The doping level of the aperture region may be $(X+3) \times XE18$ (atoms/cm$^3$).

The ratio (b/a) of the second minimum diameter (b) to the first maximum diameter (a) of the aperture may be $[95.0-(2X/3)]\%$ to $[99.9-(X/3)]\%$.

X may be 0 to 3.

The light emitting device of the embodiment may include the surface emitting laser device.

Advantageous Effects

The embodiment may provide a surface emitting laser device capable of controlling a divergence angle of beams by controlling the shape of an aperture, and a light emitting device including the same.

In addition, the embodiment may provide a surface emitting laser device capable of preventing current crowding at an aperture edge and a light emitting device including the same.

DESCRIPTION OF DRAWINGS

FIG. 1A is an exemplary diagram of a method of determining a field of interest (FOI) and a field of view (FOV) by a combination of a beam divergence and a diffuser beam angle in a VCSEL chip.

FIG. 1B is an IR micrograph of an aperture shape in a VCSEL chip of a comparative example.

FIG. 1C is a photograph of a higher mode oscillation occurring when a high current is applied in the related art.

FIG. 1D is data of a divergence angle of beams according to an applied current.

FIG. 1E is a carrier density data according to the position of the aperture in the related art (R).

FIG. 2A is a plan view of a surface emitting laser device according to an embodiment.

FIG. 2B is an enlarged view of a portion C1 of the surface emitting laser device according to the embodiment shown in FIG. 2A.

FIG. 3A is a cross-sectional view of a surface emitting laser device according to a first embodiment.

FIG. 3B is an enlarged view of a first area B1 of the surface emitting laser device according to the embodiment shown in FIG. 3A.

FIG. 4A is a partially enlarged view of an aperture region in the first embodiment.

FIG. 4B is a photograph of an aperture region in an embodiment.

FIG. 4C is a plan view illustrating an aperture region in an embodiment.

FIG. 5A is voltage data according to the current density of Comparative Examples and Embodiments.

FIG. 5B is voltage data according to a current of a comparative example and an embodiment.

FIG. 6 is a cross-sectional view of a surface emitting laser device according to a second embodiment.

FIG. 7 is an enlarged view of a second area of the surface emitting laser device according to the second embodiment shown in FIG. 6.

FIG. 8 is carrier density data according to the location of an aperture region in an embodiment.

FIG. 9 is a manufacturing conceptual diagram of a first application example of the third area B3 shown in FIG. 7.

FIG. 10 is an oxidation degree data according to the doping concentration in the surface emitting laser device according to the embodiment.

FIG. 11 is an enlarged view of a second application example to a third area of the surface emitting laser device according to the embodiment shown in FIG. 7.

FIG. 12 is an enlarged view of a third application example to a third area of the surface emitting laser device according to the embodiment shown in FIG. 7.

FIG. 13 is a conceptual diagram of a 2DHG effect in a third area of the surface emitting laser device according to the embodiment shown in FIG. 12.

FIGS. 14A to 21 are cross-sectional views of a manufacturing process of a surface emitting laser device according to an embodiment.

FIG. 22 is another cross-sectional view of a surface emitting laser device according to an embodiment.

FIG. 23 is a perspective view of a mobile terminal to which a surface emitting laser device is applied according to an embodiment.

MODE FOR INVENTION

Hereinafter, embodiments that can be realized specifically for solving the above problems will be described with reference to the accompanying drawings.

In the description of the embodiment, in the case where it is described as being formed in "on or under" of each element, the upper or lower (on or under) both elements can be in direct contact with each other or one or more other elements are formed indirectly between the two elements. In addition, when expressed as "on or under", the meaning of not only an upward direction but also a downward direction based on one element may be included.

First Embodiment

FIG. 2A is a plan view of a surface emitting laser device 200 according to an embodiment, and FIG. 2B is an enlarged view of a portion C1 of the surface emitting laser device according to the embodiment shown in FIG. 2A.

Referring to FIG. 2A, the surface emitting laser device 200 according to the embodiment may include a light emitting part E and a pad part P, and the light emitting part E may include a plurality of light emitting emitters as shown in FIG. 2B. Emitters E1, E2, and E3 may be included, and tens to hundreds of light emitting emitters may be included.

Referring to FIG. 2B, in the embodiment, in the surface emitting laser device 200, a second electrode 280 is disposed in a region other than the aperture 241, which is an aperture, and a passivation layer 270 can be disposed on a surface corresponding to the aperture 241.

Next, FIG. 3A is a cross-sectional view of the first embodiment 201 along line A1-A2 of the surface emitting laser device according to the embodiment shown in FIG. 2B, and FIG. 3B is an enlarged view of the first region B1 of the surface emitting laser device 201 as shown in FIG. 3A.

Referring to FIG. 3A, the surface light emitting laser device 201 according to the first embodiment includes a first electrode 215, a substrate 210, a first reflective layer 220, an active region 230, and an aperture region 240, the second reflective layer 250, and the second electrode 280. The aperture region 240 may include an aperture 241 and an insulating region 242. The insulating region 242 may be referred to as an oxide layer, and the aperture region 240 may be referred to as an oxide region, but is not limited thereto.

The second electrode 280 may include a contact electrode 282 and a pad electrode 284.

Hereinafter, the technical features of the surface emitting laser device 201 according to the first embodiment will be described with reference to FIGS. 3A and 3B, and the technical effects of the first embodiment will also be described with reference to FIGS. 4 to 5B. In the drawings of the embodiment, the x-axis direction may be a direction parallel to the length direction of the substrate 210, and the y-axis may be a direction perpendicular to the x-axis.

<Substrate, First Electrode>

Referring to FIG. 3A, in an embodiment, the substrate 210 may be a conductive substrate or a non-conductive substrate. When a conductive substrate is used, a metal having excellent electrical conductivity can be used, and since it must be able to sufficiently dissipate heat generated when the surface emitting laser device 201 is operated, a GaAs substrate or a metal substrate or silicon (Si) having high thermal conductivity can be used.

When using a non-conductive substrate, an AlN substrate, a sapphire ($Al_2O_3$) substrate, or a ceramic-based substrate may be used.

Meanwhile, in the embodiment, the shape of the aperture 241 may be controlled in a circular shape by controlling the off-angle of the substrate 210 in the range of about 0.5° to 2.0°. When the off-angle of the substrate 210 is less than 0.5°, growth may not proceed well, and when the off-angle exceeds 2.0°, the shape of the aperture 241 becomes an elliptical shape to diverge the emission beam such that a problem of uneven angle or widening can occur.

In an embodiment, the first electrode 215 may be disposed under the substrate 210, and the first electrode 215 may be disposed as a single layer or multiple layers of a conductive material. For example, the first electrode 215 may be a metal, and at least one of aluminum (Al), titanium (Ti), chromium (Cr), nickel (Ni), copper (Cu), and gold (Au). It is formed in a single-layer or multi-layer structure to improve electrical properties, thereby increasing light output.

<First Reflective Layer, Second Reflective Layer>

Referring to FIG. 3B, the first reflective layer 220 may be doped with a first conductivity type. For example, the first conductivity-type dopant may include an n-type dopant such as Si, Ge, Sn, Se, and Te.

In addition, the first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer made of materials having different refractive indices are alternately stacked at least once or more.

For example, as shown in FIG. 3B, the first reflective layer 220 includes a first group first reflective layer 221 disposed on the substrate 210 and a first reflective layer 221 disposed on the first group. It may include a second group of first reflective layers 222.

The first group first reflective layer 221 and the second group first reflective layer 222 may include a plurality of layers made of a semiconductor material having a composition formula of $Al_xGa_{(1-x)}As(0<x<1)$. When Al in each layer increases, the refractive index of each layer decreases, and when Ga increases, the refractive index of each layer may increase.

In addition, the thickness of each layer may be $\lambda$, $\lambda$ may be a wavelength of light generated in the active region 230, and n may be a refractive index of each layer with respect to light of the above-described wavelength. Here, $\lambda$ may be 650 to 980 nanometers (nm), and n may be the refractive index of each layer. The first reflective layer 220 having such a structure may have a reflectance of 99.999% for light in a wavelength region of about 940 nanometers.

The thickness of the layer in each of the first reflective layers 220 may be determined according to a respective refractive index and a wavelength $\lambda$ of light emitted from the active region 230.

In addition, as shown in FIG. 3B, the first group first reflective layer 221 and the second group first reflective layer 222 may be formed of a single layer or a plurality of layers, respectively.

For example, the first group first reflective layer 221 may include about 30 to 40 pairs of the first group first-first layer 221a and the first group first-second layer 221b. The first group first-first layer 221a may be formed to be thicker than the first group first-second layer 221b. For example, the first group first-first layer 221a may be formed to be about 40 to 60 nm, and the first group first-second layer 221b may be formed to be about 20 to 30 nm.

In addition, the second group first reflective layer 222 may also include about 5 to 15 pairs of the second group first-first layer 222a and the second group first-second layer 222b. The second group first-first layer 222a may be formed to be thicker than the second group first-second layer 222b. For example, the second group first-first layer 222a may be formed to be about 40 to 60 nm, and the second group first-second layer 222b may be formed to be about 20 to 30 nm.

In addition, as shown in FIG. 3B, the second reflective layer 250 may include a gallium-based compound, for example, AlGaAs, and the second reflective layer 250 may be doped with a second conductivity type dopant. The second conductivity-type dopant may be a p-type dopant such as Mg, Zn, Ca, Sr, Ba, or the like. Meanwhile, the first reflective layer 220 may be doped with a p-type dopant, or the second reflective layer 250 may be doped with an n-type dopant.

The second reflective layer 250 may also be a Distributed Bragg Reflector (DBR). For example, the second reflective layer 250 may have a structure in which a plurality of layers made of materials having different refractive indices are alternately stacked at least once or more.

Each layer of the second reflective layer 250 may include AlGaAs, and in detail, may be made of a semiconductor material having a composition formula of $Al_xGa_{(1-x)}As$ $(0<x<1)$. Here, when Al increases, the refractive index of each layer decreases, and when Ga increases, the refractive index of each layer may increase. In addition, the thickness of each layer of the second reflective layer 250 is $\kappa$, $\lambda$ may be a wavelength of light emitted from the active layer, and n may be a refractive index of each layer with respect to the light of the above-described wavelength.

The second reflective layer 250 having such a structure may have a reflectance of 99.9% for light in a wavelength region of about 940 nanometers.

The second reflective layer 250 may be formed by alternately stacking layers, and the number of pairs of layers in the first reflective layer 220 may be greater than the number of pairs of layers in the second reflective layer 250. In this case, as described above, the reflectance of the first reflective layer 220 is about 99.999%, which may be greater than the reflectance of 99.9% of the second reflective layer 250.

In an embodiment, the second reflective layer 250 includes the first group second reflective layer 251 disposed adjacent to the active region 230 and a second group second reflective layer 252 spaced apart from the active region 230 than the first group second reflective layer 251.

As shown in FIG. 3B, the first group second reflective layer 251 and the second group second reflective layer 252 may also be formed of a single layer or a plurality of layers, respectively.

For example, the first group second reflective layer 251 may include about 1 to 5 pairs of the first group second-first layer 251a and the first group second-second layer 251b. The first group second-first layer 251a may be formed to be thicker than the first group second-second layer 251b. For example, the first group second-first layer 251a may be formed to be about 40 to 60 nm, and the first group second-second layer 251b may be formed to be about 20 to 30 nm.

In addition, the second group second reflective layer 252 may also include about 5 to 15 pairs of the second group second-first layer 252a and the second group second-second layer 252b. The second group second-first layer 252a may be formed to be thicker than the second group second-second layer 252b. For example, the second group second-first layer 252a may be formed to be about 40 to 60 nm, and the second group second-second layer 252b may be formed to be about 20 to 30 nm.

<Active Region>

Continuing with reference to FIG. 3B, the active region 230 may be disposed between the first reflective layer 220 and the second reflective layer 250.

The active region 230 may include an active layer 232 and at least one or more cavities 231 and 233. For example, the active region 230 may include an active layer 232, a first cavity 231 disposed below the active layer 232, and a second cavity 233 disposed above the active layer 232. The active region 230 of the embodiment may include both the first cavity 231 and the second cavity 233, or may include only one of them.

The active layer 232 may include any one of a single well structure, a multiple well structure, a single quantum well structure, a multi quantum well (MQW) structure, a quantum dot structure, or a quantum wire structure.

The active layer 232 may include a quantum well layer 232a and a quantum barrier layer 232b using a compound semiconductor material of a group III-V element. The quantum well layer 232a may be formed of a material having an energy band gap smaller than the energy band gap of the quantum barrier layer 232b. The active layer 232 may be formed in a 1 to 3 pair structure such as InGaAs/AlxGaAs, AlGaInP/GaInP, AlGaAs/AlGaAs, AlGaAs/GaAs, GaAs/InGaAs, but is not limited thereto. A dopant may not be doped into the active layer 232.

Next, the first cavity 231 and the second cavity 233 may be formed of an $Al_yGa_{(1-y)}As(0<y<1)$ material, but is not limited thereto. For example, the first cavity 231 and the second cavity 233 may each include a plurality of layers of $Al_yGa_{(1-y)}As$.

For example, the first cavity 231 may include a first-first cavity layer 231a and a first-second cavity layer 231b. The first-first cavity layer 231a may be further spaced apart from the active layer 232 than the first-second cavity layer 231b. The first-first cavity layer 231a may be formed to be thicker than the first-second cavity layer 231b, but is not limited thereto.

For example, the first-first cavity layer 231a may be formed to be about 60 to 70 nm, and the first-second cavity layer 231b may be formed to be about 40 to 55 nm, but is not limited thereto.

In addition, the second cavity 233 may include a second-first cavity layer 233a and a second-second cavity layer 233b. The second-second cavity layer 233b may be further spaced apart from the active layer 232 compared to the second-first cavity layer 233a. The second-second cavity layer 233b may be formed to be thicker than the second-first cavity layer 233a, but is not limited thereto. For example, the second-second cavity layer 233b may be formed to be about 60 to 70 nm, and the second-first cavity layer 233a may be formed to be about 40 to 55 nm, but is not limited thereto.

<Aperture Region>

Referring back to FIG. 3A, in the embodiment, the aperture region 240 may include an insulating region 242 and an aperture 241. The aperture 241 may be referred to as an opening, and the aperture region 240 may be referred to as an opening region.

The insulating region 242 may be formed of an insulating layer, for example, aluminum oxide, and may function as a current blocking region, and an aperture 241 as a light emitting region may be defined by the insulating region 242.

For example, when the aperture region 240 includes aluminum gallium arsenide (AlGaAs), the AlGaAs of the aperture region 240 reacts with H2O to change the edge to aluminum oxide ($Al_2O_3$). Accordingly, the insulating region 242 may be formed, and a central region that does not react with H2O may be an aperture 241 made of AlGaAs.

According to the embodiment, light emitted from the active region 230 through the aperture 241 may be emitted to the upper region, and the light transmittance of the aperture 241 may be superior compared to the insulating region 242.

Referring to FIG. 3B, the insulating region 242 may include a plurality of layers. For example, the insulating region 242 may include a first insulating layer 242a and a second insulating layer 242b. The first insulating layer 242a may have a thickness equal to or different from that of the second insulating layer 242b.

On the other hand, one of the technical problems of the embodiment is to provide a surface emitting laser device capable of controlling the divergence angle of beams by controlling the shape of the aperture and a light emitting device including the same.

In addition, one of the technical problems of the embodiment is to provide a surface emitting laser device capable of preventing a current crowding phenomenon at an aperture edge and a light emitting device including the same.

The embodiment controls the divergence angle of beams by controlling the shape of the aperture circularly by performing a predetermined doping on the aperture region 240 in order to solve the above technical problem. At the same time, there is a complex technical effect that can prevent current crowding at the aperture edge.

Specifically, FIG. 4A is an enlarged view of a portion 240B of an aperture region in the first embodiment shown in FIG. 3A, FIG. 4B is a photograph of an aperture region in the embodiment, and FIG. 4C is a plan view of the aperture region 240 in the embodiment.

According to the embodiment, the aperture region 240 includes an insulating region 242 and an aperture 241. As the doping level of the aperture region 240 is controlled as $(X+3) \times E18$ (however, $0 \leq X \leq 3$) (atoms/$cm^3$), there is a technical effect of uniformly controlling the divergence angle of beams by controlling the shape of the aperture 241 in a circular shape. In an embodiment, the doping concentration unit $1 \times E18$ may mean $10^{18}$. According to an embodiment, the range of X is 0 to 3, so that the shape of the aperture 241 is controlled to be circular, so that the divergence angle of the exit beam can be uniformly controlled. In addition, preferably, the range of X is 0.5 to 2.5, more preferably 1 to 2, so that the shape of the aperture 241 is controlled to be circular, so that the divergence angle of the exit beam can be more uniformly controlled. In an embodiment, the doping concentration can be measured by SIMS.

The aperture region 240, for example, the aperture 241 may be a layer doped with a second conductivity type element. For example, the aperture 241 may be doped with one or more of Be, Mg, C, and Zn, but is not limited thereto.

In this case, according to the embodiment, the aperture 241 defined by the insulating region 242 may be formed in a circular shape, as shown in the picture of the aperture region in the embodiment of FIG. 4B. FIG. 4b was measured with a microscope equipped with an IR CCD.

Specifically, referring to the schematic plan view of the aperture region in the embodiment of FIG. 4C, the aperture 241 defined by the insulating region 242 in the embodiment is circular, and it may have a first maximum diameter (a) to a predetermined first direction in the circle and a second maximum diameter (b) in a second direction perpendicular to the first direction.

At this time, in the embodiment, the ratio (b/a) of the second maximum diameter (b) to the first maximum diameter (a) of the aperture 241 is $[95.0-(2X/3)]\%$ to $[99.9-(X/3)]\%$ (however, $0 \leq X \leq 3$), there is a technical effect of controlling the divergence angle of beams by controlling the shape of the aperture 241 in a circular shape. According to an embodiment, the range of X is controlled to be 0 to 3, so that the shape of the aperture 241 is controlled to be circular, so that the divergence angle of the exit beam can be uniformly controlled. In addition, preferably, the range of X is 0.5 to 2.5, more preferably 1 to 2, so that the shape of the aperture 241 is controlled to be circular, so that the divergence angle of the exit beam can be more uniformly controlled.

In the embodiment, when the ratio (b/a) of the first maximum diameter (a) and the second maximum diameter (b) of the aperture 241 is less than the lower limit, the shape of the aperture in a non-circular state, as a result, there is a problem that the diverging angle of the exit beam becomes wider and irregular.

Referring to FIG. 4A for a moment, the aperture region 240 of the embodiment includes an insulating region 242 and an aperture 241, and the doping level of the aperture region 240 is controlled as $(X+3) \times E18$ (however, $0 \leq X \leq 3$) (atoms/$cm^3$) such that the shape of the aperture 241 can be controlled in a circular shape.

At this time, a dopant having a concentration of $(X+3) \times E18$ (however, $0 \leq X \leq 3$) (atoms/$cm^3$) is injected into the AlGaAs-based preliminary aperture layer (not shown) for forming the aperture region 240. If the oxidation process proceeds afterwards, the doping concentration of the aperture 241 is maintained at (X+3)×E18 (however, 0≤X≤3) (atoms/cm$^3$), but Since its concentration of the dopant of the insulating region 242 is lowered, it can function as a current confining layer without leakage issues.

For example, the dopant existing at the position of the insulating region 242 is difficult to function as a conductive layer due to oxidation, and exists as an oxide combined with oxygen or as a pore, or a part of the dopant in the insulating region 242 may exist in an unoxidized state.

According to the embodiment, when the oxidation process is performed on the AlGaAs-based preliminary aperture layer (not shown), the bonding force due to the increase in the doping level is weakened, and the reaction force with water vapor is strengthened, thereby forming a uniform aperture shape.

For example, in the presence of a dopant having a concentration of (X+3)×E18 (however, 0≤X≤3) (atoms/cm$^3$) in the AlGaAs-based preliminary aperture layer (not shown), the dopant C is positioned at the As position, therefore it is possible to create a uniform aperture shape as the mutual bonding strength is weakened and the reaction force with water vapor is strengthened.

Next, FIG. 5A is voltage data according to the current density of Comparative Example (R1) and First Example (EB1), and FIG. 5B is voltage data according to current of Comparative Example (R1) and First Example (EB1).

The driving voltage in the first example EB1 and the comparative example R1 is the result of measuring Vf for each current using an integrating sphere at the package (PKG) end. Meanwhile, it is also possible to measure the driving voltage by measuring it with a probe device at the chip end.

According to the embodiment, there is a technical effect of preventing current crowding at the aperture edge according to doping of the aperture region, and the aperture is formed by doping the aperture region. There is a complex technical effect that can control the divergence angle of beams by controlling the shape of a circular shape.

For example, in FIGS. 5A and 5B, the doping concentration for the aperture region in Comparative Example R1 is about 1E18 (atoms/cm$^3$), and the doping concentration for the first example EB1 is about 5E18 (atoms/cm$^3$), but is not limited thereto.

Referring to FIGS. 5A and 5B, compared to Comparative Example R1, in the first example EB1, the current density or the driving voltage according to the current decreases due to the decrease in resistance due to the increase in carriers in the aperture 241, thereby improving the driving voltage.

In the embodiment, when the doping range in the aperture region is less than the lower limit of (X+3)×E18 (however, 0≤X≤3) (atoms/cm$^3$), the improvement of the driving voltage is insignificant, and the shape of the aperture 241 can be an oval shape, so the divergence angle may not be controlled.

On the other hand, if the doping range in the aperture region exceeds the upper limit of (X+3)×E18 (however, 0≤X≤3) (atoms/cm$^3$), there may be a leakage issue in the insulating region, and light due to the dopant optical properties may be degraded by absorption.

Referring back to FIG. 3A, in the embodiment, the substrate 210 includes the first reflective layer 220, the active region 230, and the aperture region 240 to be grown in consideration of the growth crystal direction.

For example, in an embodiment, an off-angle of the substrate 210 may be (X+0.5)°, and X may be 0 to 3. Preferably, X may be controlled from 0 to 1.5.

For example, in the embodiment, the off-angle of the substrate 210 is controlled to be (X+0.5)°, for example, in the range of about 0.5° to 3.5° to control the shape of the aperture 241 in a circular shape. If the off-angle of the substrate 210 is less than 0.5°, growth may not proceed well, and when the off-angle exceeds 3.5°, the shape of the aperture 241 becomes an elliptical shape and there may be a problem that the divergence angle of the beam becomes non-uniform or widens.

In addition, for example, by controlling the off-angle of the substrate 210 in a range of about 0.5° to 2.0°, the shape of the aperture 241 may be further controlled to be circular.

In addition, according to an embodiment, the doping level of the aperture region 240 is controlled as (X+3)×E18 (atoms/cm$^3$) while the off-angle of the substrate 210 is controlled as (X+0.5)°. By this, the ratio (b/a) of the first maximum diameter (a) of the aperture 241 to the second minimum diameter (b) is improved in a more circular shape. There is a technical effect of very uniformly controlling the divergence angle of beams.

<Second Contact Electrode, Passivation Layer, Second Electrode>

FIG. 3A, the surface emitting laser device 201 according to the embodiment is mesa-etched from the second reflective layer 250 to the insulating region 242 and the active region 230 in a region around the aperture 241. Also, a part of the first reflective layer 220 may be mesa etched.

A second contact electrode 282 may be disposed on the second reflective layer 250. A region between the second contact electrodes 282 where the second reflective layer 250 is exposed may correspond to the above-described aperture 241.

The second contact electrode 282 may improve contact characteristics between the second reflective layer 250 and the second pad electrode 284 to be described later.

In FIG. 3A, a passivation layer 270 may be disposed on side surfaces and top surfaces of the light emitting structure mesa etched and on the top surface of the first reflective layer 220. The passivation layer 270 is also disposed on a side surface of the surface emitting laser device 201 separated by device units, and protects and insulates the surface emitting laser device 201. The passivation layer 270 may be made of an insulating material, for example, a nitride or an oxide. For example, the passivation layer 270 may include at least one of polymide, silica ($SiO_2$), or silicon nitride ($Si_3N_4$).

The passivation layer 270 may have a thickness smaller than the second contact electrode 282 on the upper surface of the light emitting structure, and through this, the second contact electrode 282 may be exposed over the passivation layer 270. The second pad electrode 284 may be disposed in electrical contact with the exposed second contact electrode 282, and the second pad electrode 284 extends above the passivation layer 270 and is disposed to provide current from the outside.

The second pad electrode 284 may be made of a conductive material, for example, a metal. For example, the second pad electrode 284 includes at least one of aluminum (Al), titanium (Ti), chromium (Cr), nickel (Ni), copper (Cu), and gold (Au) and can be formed in a multilayer structure.

The embodiment may provide a surface emitting laser device capable of controlling a divergence angle of beams by controlling the shape of an aperture, and a light emitting device including the same.

In addition, the embodiment may provide a surface emitting laser device capable of preventing current crowding at an aperture edge and a light emitting device including the same.

Second Embodiment

Next, FIG. 6 is a cross-sectional view of the surface emitting laser device 202 according to the second embodiment, and FIG. 7 is an enlarged view of a second region B2 of the surface emitting laser device according to the second embodiment shown in FIG. 6.

The second embodiment may employ the technical features of the first embodiment, and the main features of the second embodiment will be described below.

The surface light emitting laser device 202 according to the second embodiment includes a first electrode 215, a substrate 210, a first reflective layer 220, an active region 230, an aperture region 240, and a second reflective layer 250 and the second electrode 280. The aperture region 240 may include an aperture 241 and an insulating region 242.

The second embodiment may include a delta doped layer 241c disposed between the active region 230 and the second reflective layer 250. For example, the aperture region 240 may include an insulating region 242, an aperture 241, and a delta doped layer 241c.

For example, the surface light emitting laser device 202 according to the second embodiment includes a first electrode 215, a substrate 210 disposed on the first electrode 215, a first reflective layer 220 disposed on an upper surface of the substrate 210, an active region 230 disposed on the first reflective layer 220, an aperture region 240 including an aperture 241 and an insulating region 242, a second reflective layer 250 disposed on the aperture region 240, a second electrode 280 disposed on the second reflective layer 250, and a delta doped layer 241c disposed between the active region 230 and the second reflective layer 250.

As described above, one of the technical problems in the embodiment is to provide a surface light emitting laser device capable of preventing current crowding at the aperture edge and a light emitting device including the same.

In addition, one of the technical problems of the embodiment is to provide a surface light emitting laser device capable of mitigating a diffraction phenomenon of light at an aperture edge and a light emitting device including the same.

In order to solve this technical problem, the surface light emitting laser device 202 according to the second embodiment as shown in FIG. 6 may include a delta doped layer 241c disposed between the active region 230 and the second reflective layer 250.

Specifically, as shown in FIG. 7, the delta doped layer 241c may be disposed in the aperture 241. The delta doped layer 241c may be a layer doped with a second conductivity type element. For example, the delta doped layer 241c may be doped with one or more of Be, Mg, C, and Zn, but is not limited thereto. The delta doped layer 241c may be doping in a delta function with respect to the y-axis direction, which is the growth direction of the epi layer, and there may be no difference in doping concentration in the x-axis direction, which is the plane direction.

Next, FIG. 8 is carrier density data EB2 according to the position of the aperture region in the embodiment. For example, the x-axis of FIG. 8 is data of the hole density according to the distance r from the center of the aperture.

In the related art (R2), current crowding (C) occurs in which the hole density at the aperture edge rapidly increases as a low current to a high current is applied, and current crowding at the aperture edge occurs. There is a problem that a higher mode is oscillated by this, and the higher mode oscillation increases the divergence angle of beams.

According to the embodiment, by disposing the delta doped layer 241c doped with the second conductivity type element in the aperture 241, the current density phenomenon at the aperture edge is prevented by even current diffusion in the aperture 241. By preventing, there is a technical effect of providing a surface light emitting laser device capable of producing uniform light output in the entire aperture region according to current diffusion and a light emitting device including the same. In embodiment Example EB2, carbon (C) was used as the second conductive type element, and the experiment was conducted based on the concentration of about $8 \times 10^{18}$ cm$^{-3}$.

In addition, in the embodiment, by disposing the delta doped layer 241c doped with the second conductivity type element in the aperture 241, current crowding in the aperture can be prevented by current diffusion in the aperture 241. Accordingly, There is a technical effect in that the embodiment can solve the problem of increasing the divergence angle of beams by preventing high-order mode oscillation by preventing current crowding at the aperture edge.

In addition, in the embodiment, a current flowing from the second electrode 280 to the first electrode 215 flows toward the center of the aperture region 240 by the delta doped layer 241c doped with a second conductivity type element. Accordingly, there is a technical effect of preventing current congestion at the aperture edge, preventing higher mode oscillation, and solving the problem of increasing the divergence angle of beams.

Next, FIG. 9 is a manufacturing conceptual diagram of a first application example B3a of the third area B3 shown in FIG. 7.

As shown in FIG. 9, an AlGa-based layer 241a for forming the aperture region 240 is formed on the active region 230, and during the growth of the AlGa-based layer 241a, the second conductive element is doped. The delta doped layer 241c may be disposed in the AlGa-based layer 241a. The AlGa-based layer 241a may include a material such as $Al_zGa_{(1-z)}As$ (0<z<1), but is not limited thereto.

The delta doped layer 241c may be a delta functional doping with respect to the y-axis direction, which is the growth direction of the AlGa-based layer 241a, and there may be no difference in doping concentration in the x-axis direction, which is the plane direction.

In an embodiment, the delta doped layer 241c may be doped with a second conductivity type element, but is not limited thereto. For example, the delta doped layer 241c may be doped with one or more of Be, Mg, C, and Zn, but is not limited thereto.

Meanwhile, FIG. 10 is data on the degree of oxidation according to the doping concentration in the surface light emitting laser device according to the embodiment.

Referring to FIG. 10, it can be seen that as the doping concentration increases from the first doping concentration D1 to the second doping concentration D2, oxidation is promoted and the thickness of the oxide layer increases.

Accordingly, the embodiment uses this principle to form the delta doped layer 241c on the AlGa-based layer 241a as shown in FIG. 9 and then proceeds with the oxidation process. Accordingly, the insulating region 242 is formed by delta doping of the second conductivity type element, the oxidation rate in the x-axis direction may be controlled, and a sharp edge may be implemented by selective or dominant oxidation of the delta-doped region as shown in FIG. 7.

In the embodiment, the delta doped layer existing at the location of the insulating layer 242 is difficult to function as a conductive layer due to oxidation, and exists as an oxide combined with oxygen or it may exist in a state as a pore, or partially oxidized in the insulating layer 242.

Referring back to FIG. 7, in an embodiment, an inner end of the insulating region 242 may overlap the delta doped layer 241c in a first direction (x-axis direction).

In addition, in an embodiment, the minimum thickness of the insulating region 242 may be in contact with the delta doped layer 241c. For example, a sharp edge due to predominant oxidation of the insulating region 242 may contact the delta doped layer 241c positioned in the aperture 241.

According to the embodiment, as shown in FIG. 7, the delta doped layer 241c may be present in the aperture 241 and the insulating region 242 may be formed to have a thinner thickness in the direction of the aperture 241. For example, in an embodiment, the first thickness T1 in the outer region of the insulating region 242 may be thicker than the second thickness T2 in the inner region adjacent to the aperture 241.

Accordingly, according to an embodiment, the insulating region 242 has a second thickness T2 in the inner region adjacent to the aperture 241 to be thinner than the first thickness T1 in the outer region. It is possible to solve the problem of increasing the divergence angle of beams by mitigating the diffraction phenomenon.

In an embodiment, the first thickness T1 of the outer region of the insulating region 242 may be about 5 nm to 50 nm. When the thickness of the insulating region 242 is less than 5 nm, problems may occur in current and optical confinement. On the other hand, when the thickness of the insulating region 242 exceeds 50 nm, there is a problem of an increase in a driving voltage or an increase in a beam divergence angle. In addition, since the thickness of the insulating region 242 is controlled to be 10 nm to 30 nm, the effect of current and optical confinement is further increased, and the problem of increasing the divergence angle of the beam may be minimized.

In the embodiment, the doping concentration of the delta doped layer 241c may be about $7 \times 10^{18}$ to $1 \times 10^{20}$ atoms/cm$^3$. As oxidation proceeds preferentially along the delta doped layer 241c, the insulating region 242 may be formed to be thinner in the direction of the aperture 241 as shown in FIG. 7.

In the embodiment, the doping concentration of the delta doped layer 241c is preferably controlled at about $8 \times 10^{18} \sim 1 \times 10^{19}$ atoms/cm$^3$, so that the inner side is sharp as oxidation proceeds more preferentially in the delta doped layer 241c. As the insulating region 242 is implemented, the diffraction phenomenon of light at the edge of the aperture 241 can be significantly reduced to prevent an increase in the divergence angle of the beam, and the crystal quality of the AlGa-based layer 241a can be further improved.

In addition, in the embodiment, the dopant concentration of the delta doped layer 241c may be higher than the dopant concentration doped in other layers. For example, in the embodiment, the dopant concentration of the delta doped layer 241c may be higher than the concentration of the second conductivity type dopant of the second reflective layer 250, and accordingly, oxidation proceeds preferentially along the delta doped layer 241c. Accordingly, the insulating region 242 may be formed to be thinner in the direction of the aperture 241.

In the embodiment, the delta doped layer 241c may be formed to have a thickness in atomic units, and may be confirmed by analysis equipment such as SIMS. According to an embodiment, the oxidation rate of the insulating region 242 is controlled by delta doping of the second conductivity type element, and a sharp edge is implemented by selective or dominant oxidation of the delta-doped region. The second thickness T2 in the inner region adjacent to the aperture 241 of 242 is formed to be thinner than the first thickness T1 in the outer region, therefore it is possible to solve the problem of increasing the divergence angle of beams by reducing the diffraction phenomenon of light at the aperture 241 to reduce the divergence angle of the beam.

Next, FIG. 11 is an enlarged view of a second application example B3b to the third region B3 of the surface light emitting laser device according to the embodiment shown in FIG. 7.

The second application example (B3b) to the third area (B3) may employ the technical characteristics of the first application example (B3a), and will be described below with the focus on the technical characteristics of the second application example (B3b).

In the second application example B3b to the third region B3, the aperture 241 may include a plurality of AlGa-based layers 241a, for example, the first AlGa-based layer 241a1 and the second AlGa-based layer 241a2 may be included, and the Al concentration may be different. The first AlGa-based layer 241a1 and the second AlGa-based layer 241a2 may include different materials.

For example, the first AlGa-based layer 241a1 may include Al$_{z1}$Ga$_{(1-z1)}$As(0<Z1<1), and the second AlGa-based layer 241a2 is Al$_{z2}$Ga$_{(1-z2)}$N (0<Z2<1) may be included, but is not limited thereto.

For example, the second Al concentration of the second AlGa-based layer 241a2 may be higher than that of the first Al of the first AlGa-based layer 241a1. In addition, a delta doped layer 241c may be disposed on the second AlGa-based layer 241a2 having a high Al concentration.

In this case, the Al concentration of Al$_{z2}$Ga$_{(1-z2)}$N (0<Z2<1) of the second AlGa-based layer 241a2 may be graded. For example, the Al concentration of the second AlGa-based layer 241a2 may have the highest Al concentration at its center, and the concentration gradually lowered in the growth direction (y-axis direction) or the opposite direction (–y-axis direction).

In the second application example (B3b), when the second AlGa-based layer 241a2 contains Al$_z$Ga$_{(1-z)}$As (0<z<1), Al concentrations of the Al$_z$Ga$_{(1-z)}$As (0<z<1) can be graded. For example, the Al concentration may be the highest in the central portion of the second AlGa-based layer 241a2 itself, and the Al concentration may gradually decrease in the –y-axis direction opposite to the y-axis direction.

According to the second application example (B3b), by providing the second AlGa-based layer 241a2 to which the Al concentration is graded, the most dominant oxidation proceeds at the center thereof, thereby realizing a sharper edge.

Accordingly, according to the second application example (B3b), the second thickness T2 in the inner region adjacent to the aperture 241 of the insulating region 242 is formed to be thinner than the first thickness T1 in the outer region such that it is possible to solve the problem of increasing the divergence angle of beams by mitigating the diffraction phenomenon of light at aperture 241.

In addition, in the second application example (B3b), by disposing the delta doped layer 241c doped with the second conductivity-type element in the aperture 241, the current is concentrated in the aperture due to current diffusion in the aperture 241 such that a surface light emitting laser device capable of solving the problem of increasing the divergence angle of beams by preventing high-order mode oscillation at the aperture edge by preventing current crowding, and a light emitting device including this can be provided.

Next, FIG. 12 is an enlarged view of a third application example B3c to the third region B3 of the surface light emitting laser device according to the embodiment shown in FIG. 7.

The third application example (B3c) may employ the technical features of the first and second application examples, and will be described below, focusing on the technical features of the third application example.

In the third application example B3c, the aperture 241 may include a first AlGa-based layer 241a1 and a GaAs-based layer 241a3.

For example, the first AlGa-based layer 241a1 may include $Al_zGa_{(1-z)}As$ (0<z<1), and the GaAs-based layer 241a3 may include a GaAs layer, but is not limited thereto.

In addition, the third application example (B3c) may include a delta doped layer 241c in the GaAs-based layer 241a3.

In the third application example (B3c), after forming the delta doped layer 241c on the GaAs-based layer 241a3, as the oxidation process proceeds, the delta doped layer 241c is present in the aperture 241 as shown in FIG. 12. The thickness of the insulating region 242 may be formed in the shape of a sharp edge in the direction of the aperture 241.

For example, in an embodiment, the first thickness T1 in the outer region of the insulating region 242 may be thicker than the second thickness T2 in the inner region adjacent to the aperture 241.

According to the third application example B3c, the first thickness T1 in the outer region of the insulating region 242 may be thicker than the second thickness T2 in the inner region. Accordingly, in the embodiment, the second thickness T2 in the inner region adjacent to the aperture 241 of the insulating region 242 is formed to be thinner than the first thickness T1 in the outer region, thus it is possible to solve the problem of increasing the divergence angle of beams by mitigating the diffraction phenomenon in the aperture 241.

In addition, in the third application example (B3c), by disposing the delta doped layer 241c doped with the second conductivity-type element in the aperture 241, the current is concentrated in the aperture due to current diffusion in the aperture 241 such that a surface light emitting laser device capable of solving the problem of increasing the divergence angle of beams by preventing high-order mode oscillation at the aperture edge by preventing current crowding, and a light emitting device including this can be provided.

FIG. 13 is a conceptual diagram illustrating a 2DHG (2-dimensional hole gas) effect in the third region B3c of the surface light emitting laser device according to the embodiment illustrated in FIG. 12.

According to the third application example (B3c), a GaAs-based layer 241a3 is disposed between the first AlGa-based layers 241a1 as shown in FIG. 12, thereby a 2DHG (2-dimensional hole gas) is formed as shown in FIG. 12 and the carrier distribution uniformity in the aperture region can be remarkably improved by current spreading.

Further, according to the third application example (B3c), a GaAs layer, which is a GaAs-based layer 241a3, is disposed between the AlGaAs layer, which is the AlGa-based layer 241a. Accordingly, a 2DHG (2-dimensional hole gas) may be formed to prevent current crowding in the aperture by current spreading through 2DHG such that a surface light emitting laser device capable of solving the problem of increasing the divergence angle of beams by preventing oscillation in a higher mode at the aperture edge, and a light emitting device including the same can provided.

The second embodiment has a technical effect of controlling the divergence angle of beams by controlling the shape of the aperture, which is a technical feature of the first embodiment, to a circular shape. In addition, in the second embodiment, there are multiple effects in that current crowding can be prevented at the aperture edge by current diffusion in the aperture 241 by disposing the delta-doped layer 241c in the aperture 241.

(Manufacturing Method)

Hereinafter, a method of manufacturing a surface light emitting laser device according to an embodiment will be described with reference to FIGS. 14A to 21, and a method of manufacturing the first embodiment will be described.

First, as shown in FIG. 14A, a light emitting structure including a first reflective layer 220, an active region 230, and a second reflective layer 250 are formed on a substrate 210.

The substrate 210 may be formed of a material suitable for growth of semiconductor materials or may be a carrier wafer. The substrate 210 may be formed of a material having excellent thermal conductivity, and may include a conductive substrate or an insulating substrate.

For example, when the substrate 210 is a conductive substrate, a metal having excellent electrical conductivity can be used, and since it is able to sufficiently dissipate heat generated during operation of the surface light emitting laser device 200, a GaAs substrate having high thermal conductivity, alternatively, a metal substrate or a silicon (Si) substrate may be used.

In addition, when the substrate 210 is a non-conductive substrate, an AlN substrate, a sapphire ($Al_2O_3$) substrate, or a ceramic-based substrate may be used.

In addition, in the embodiment, the same type of substrate as the first reflective layer 220 may be used as the substrate 210. For example, when the substrate 210 is a GaAs substrate of the same kind as the first reflective layer 220, the first reflective layer 210 and the lattice constant match, so that defects such as lattice mismatch do not occur in the first reflective layer 220.

Meanwhile, in the embodiment, the substrate 210 may control the shape of the aperture 241 in consideration of the growth crystal direction of the first reflective layer 220, the active region 230, and the aperture region 240, which are subsequently grown.

For example, in the embodiment, the shape of the aperture 241 may be controlled in a circular shape by controlling the off-angle of the substrate 210 in a range of about 0.5° to 2.0°. If the off-angle of the substrate 210 is less than 0.5°, growth may not proceed well, and while the off angle exceeds 2.0°, problems can arise in that the shape of the aperture 241 becomes an elliptical shape and the divergence angle of the exit beam becomes non-uniform or widens.

Next, the first reflective layer 220 may be formed on the substrate 210, and FIG. 14B is an enlarged view of the first-second region B1a of the surface light emitting laser device according to the embodiment shown in FIG. 14A.

Hereinafter, a surface light emitting laser device according to an embodiment will be described with reference to FIGS. 14A and 14B together.

The first reflective layer 220 may be grown using a method such as chemical vapor deposition (CVD), molecular beam epitaxy (MBE), sputtering, or hydroxide vapor phase epitaxy (HYPE).

The first reflective layer 220 may be doped with a first conductivity type. For example, the first conductivity-type dopant may include an n-type dopant such as Si, Ge, Sn, Se, and Te.

The first reflective layer 220 may include a gallium-based compound, for example, AlGaAs, but is not limited thereto. The first reflective layer 220 may be a Distributed Bragg Reflector (DBR). For example, the first reflective layer 220 may have a structure in which layers made of materials having different refractive indices are alternately stacked at least once or more.

For example, as shown in FIG. 14B, the first reflective layer 220 may include a first group first reflective layer 221 on the substrate 210 and a second group first reflective layer 222 on the first group first reflective layer 221.

The first group first reflective layer 221 and the second group first reflective layer 222 include a plurality of layers made of a semiconductor material having a composition formula of $Al_xGa_{(1-x)}As(0<x<1)$. If Al in each layer increases, the refractive index of each layer decreases, and when Ga increases, the refractive index of each layer may increase.

In addition, as shown in FIG. 14B, the first group first reflective layer 221 and the second group first reflective layer 222 may be formed of a single layer or a plurality of layers, respectively. For example, the first group first reflective layer 221 may include about 30 to 40 pairs of the first group first-first layer 221a and the first group first-second layer 221b. In addition, the second group first reflective layer 222 may also include about 5 to 15 pairs of the second group first-first layer 222a and the second group first-second layer 222b.

Next, an active region 230 may be formed on the first reflective layer 220.

As shown in FIG. 14B, the active region 230 may include an active layer 232, a first cavity 231 disposed below the active layer 232, and a second cavity 233 disposed above the active layer 232. The active region 230 of the embodiment may include both the first cavity 231 and the second cavity 233, or may include only one of them.

The active layer 232 may include a well layer 232a and a barrier layer 232b using a compound semiconductor material of a group III-V element. The active layer 232 may be formed in 1 to 3 pair structure such as InGaAs/AlxGaAs, AlGaInP/GaInP, AlGaAs/AlGaAs, AlGaAs/GaAs, GaAs/InGaAs, but is not limited thereto. A dopant may not be doped into the active layer 232.

The first cavity 231 and the second cavity 233 may be formed of an $Al_yGa_{(1-y)}As(0<y<1)$ material, but is not limited thereto. For example, the first cavity 231 and the second cavity 233 may each include a plurality of layers of $Al_yGa_{(1-y)}As$.

For example, the first cavity 231 may include a first-first cavity layer 231a and a first-second cavity layer 231b. In addition, the second cavity 233 may include a second-first cavity layer 233a and a second-second cavity layer 233b.

Next, an AlGa-based layer 241a for forming the aperture region 240 may be formed on the active region 230.

In an embodiment, the delta doped layer 241c may be disposed in the AlGa-based layer 241a by doping with the second conductivity type element during the growth of the AlGa-based layer 241a. The AlGa-based layer 241a may include a material such as $Al_zGa_{(1-z)}As$ $(0<z<1)$, but is not limited thereto.

The AlGa-based layer 241a may include a conductive material, and may include the same material as the first reflective layer 220 and the second reflective layer 250, but is not limited thereto.

For example, when the AlGa-based layer 241a includes an AlGaAs-based material, the AlGa-based layer 241a is a semiconductor material having a composition formula of $Al_xGa_{(1-x)}As(0<x<1)$. It may have a composition formula, for example, $Al_{0.98}Ga_{0.02}As$, but is not limited thereto.

Technical characteristics of the AlGa-based layer 241a and the delta doped layer 241c will be described in detail later with reference to FIGS. 13A to 13E.

Next, a second reflective layer 250 may be formed on the AlGa-based layer 241a.

The second reflective layer 250 may include a gallium-based compound, for example, AlGaAs. For example, each layer of the second reflective layer 250 may include AlGaAs, and in detail, may be formed of a semiconductor material having a composition formula of $Al_xGa_{(1-x)}As(0<x<1)$.

The second reflective layer 250 may be doped with a second conductivity type dopant. For example, the second conductivity-type dopant may be a p-type dopant such as Mg, Zn, Ca, Sr, Ba, or the like. Meanwhile, the first reflective layer 220 may be doped with a p-type dopant, or the second reflective layer 250 may be doped with an n-type dopant.

The second reflective layer 250 may also be a Distributed Bragg Reflector (DBR). For example, the second reflective layer 250 may have a structure in which a plurality of layers made of materials having different refractive indices are alternately stacked at least once or more.

For example, the second reflective layer 250 may include a first group second reflective layer 251 disposed adjacent to the active region 230 and a second group of second reflective layers 252 spaced apart from the active region 230 than the first group second reflective layer 251.

In addition, the first group second reflective layer 251 and the second group second reflective layer 252 may be formed of a single layer or a plurality of layers, respectively. For example, the first group second reflective layer 251 may include about 1 to 5 pairs of the first group second-first layer 251a and the first group second-second layer 251b. In addition, the second group second reflective layer 252 may also include about 5 to 15 pairs of the second group second-first layer 252a and the second group second-second layer 252b.

Next, as shown in FIG. 15, the light emitting structure may be mesa etched using a predetermined mask 300. In this case, from the second reflective layer 250 to the AlGa-based layer 241a and the active region 230 may be mesa etched, and a portion of the first reflective layer 220 may be mesa etched. In mesa etching, the AlGa-based layer 241a and the active region 230 can be removed from the second reflective layer 250 in the peripheral region by an inductively coupled plasma (ICP) etching method, and the side of the mesa etch region has a slope.

Next, as shown in FIG. 16, the edge region of the AlGa-based layer may be changed to the insulating region 242, for example, it may be changed by wet oxidation. Through this, the aperture region 240 including the insulating region 242 and the aperture 241 that is a non-oxidized region may be formed.

For example, when oxygen is supplied from the edge region of the AlGa-based layer 241a, AlGaAs of the AlGa-based layer reacts with $H_2O$ to form aluminum oxide $(Al_2O_3)$. At this time, the reaction time and the like are adjusted so that the central region of the AlGa-based layer does not react with oxygen and only the edge region reacts with oxygen to form the insulating region 242 of aluminum oxide.

In addition, the embodiment may change the edge region of the AlGa-based layer to the insulating region 242 through ion implantation, but is not limited thereto. During ion implantation, photons may be supplied with an energy of 300 keV or more.

After the above-described reaction process, conductive AlGaAs may be disposed in the central region of the aperture region 240 and non-conductive $Al_2O_3$ may be disposed in the edge region. AlGaAs in the central region is a portion through which light emitted from the active region 230 proceeds to the upper region, and may be defined as an aperture 241.

On the other hand, one of the technical problems of the embodiment is to provide a surface emitting laser device capable of controlling the divergence angle of beams by controlling the shape of the aperture and a light emitting device including the same.

In addition, one of the technical problems of the embodiment is to provide a surface emitting laser device capable of preventing a current crowding phenomenon at an aperture edge and a light emitting device including the same.

The embodiment controls the divergence angle of beams by controlling the shape of the aperture circularly by performing a predetermined doping on the aperture region 240 in order to solve the above technical problem. At the same time, there is a complex technical effect that can prevent current crowding at the aperture edge.

Specifically, FIG. 17 is an enlarged view of a portion 240B of an aperture region in the first embodiment shown in FIG. 16, FIG. 18A is a photograph of an aperture region in the embodiment, and FIG. 18B is an exemplary plan view of an aperture in the embodiment.

Referring to FIG. 17, according to an embodiment, the aperture region 240 includes an insulating region 242 and an aperture 241, and there is technical effect in that the embodiment can uniformly control the divergence angle of beams by controlling the shape of the aperture 241 in a circular shape by controlling a doping level of the aperture region 240 as (X+3)E18 (however, 0≤X≤3)(atoms/cm$^3$). In an embodiment, the doping concentration unit E18 may mean $10^{18}$.

In the aperture region 240, for example, the aperture 241 may be a layer doped with a second conductivity type element. For example, the aperture 241 may be doped with one or more of Be, Mg, C, and Zn, but is not limited thereto.

In this case, according to the embodiment, the aperture 241 defined by the insulating region 242 may be formed in a circular shape, as in the picture of the aperture region in the embodiment of FIG. 18A.

Specifically, referring to the exemplary plan view of the aperture region in the embodiment of FIG. 18B, the aperture 241 defined by the insulating region 242 in the embodiment is circular, and a predetermined first direction in the circle. It may have a first maximum diameter (a) to first direction and a second maximum diameter (b) in a second direction perpendicular to the first direction.

At this time, in the embodiment, the ratio (b/a) of the first maximum diameter (a) and the second maximum diameter (b) of the aperture 241 can be [95.0−(2X/3)]% to [99.9−(X/3)]% (however, 0≤X≤3), there is a technical effect of controlling the divergence angle of beams by controlling the shape of the aperture 241 in a circular shape.

In the embodiment, when the ratio (b/a) between the first maximum diameter (a) and the second maximum diameter (b) of the aperture 241 is less than the lower limit, the shape of the aperture in a non-circular state, as a result, the divergence angle of the exit beam becomes wider and irregular.

Referring to FIG. 18B, the aperture region 240 of the embodiment includes an insulating region 242 and an aperture 241, and a doping level of the aperture region 240 can be controlled as (X+3)E18 (However, 0≤X≤3) (atoms/cm$^3$), the shape of the aperture 241 can be controlled in a circular shape. At this time, a dopant having a concentration of (X+3)E18 (however, 0≤X≤3) (atoms/cm$^3$) is injected into the AlGaAs-based preliminary aperture layer (not shown) for forming the aperture region 240. If the oxidation process proceeds afterwards, the doping concentration of the aperture 241 is maintained at (X+3)E18 (however, 0≤X≤3) (atoms/cm$^3$), but since its concentration of the dopant of the insulating region 242 is lowered, it can function as a current confining layer without leakage issues.

For example, the dopant existing at the position of the insulating region 242 is difficult to function as a conductive layer due to oxidation, and exists as an oxide combined with oxygen or as a pore, or a part of the dopant in the insulating region 242 may exist in an unoxidized state.

According to an embodiment, when the oxidation process is performed on the AlGaAs-based preliminary aperture layer (not shown), the bonding force due to the increase in the doping level is weakened, and the reaction force with water vapor is strengthened, thereby forming a uniform aperture shape. For example, in the presence of a dopant having a concentration of (X+3)E18 (however, 0≤X≤3) (atoms/cm$^3$) in the AlGaAs-based preliminary aperture layer (not shown), the dopant C is positioned at the As position. Therefore, it is possible to create a uniform aperture shape as the mutual bonding strength is weakened and the reaction force with water vapor is strengthened.

Next, FIG. 19A is voltage data according to current density in comparative example R1 and embodiment example EB1, and FIG. 19B is voltage data according to current in comparative example R1 and first embodiment example (EB1).

According to the embodiment, there is a technical effect of preventing current crowding at the aperture edge according to doping of the aperture region, and the aperture is formed by doping the aperture region. There is a complex technical effect that can control the divergence angle of beams by controlling the shape of a circular shape.

For example, in FIGS. 19A and 19B, the doping concentration for the aperture region in comparative example R1 is about 1E18 (atoms/cm$^3$), and the doping concentration for the first embodiment example EB1 is about 5E18 (atoms/cm$^3$), but is not limited thereto.

As shown in FIGS. 19A and 19B, compared to comparative example R1, in the first embodiment example EB1, the current density or the driving voltage according to the current is lowered due to the decrease in resistance due to the increase in carriers in the aperture 241, thereby improving the driving voltage.

In the embodiment, when the doping range in the aperture region is less than the lower limit of (X+3)E18 (however, 0≤X≤3) (atoms/cm$^3$), the improvement of the driving voltage is insignificant, and the shape of the aperture 241 can be an oval shape, so the divergence angle may not be controlled.

On the other hand, if the doping range in the aperture region exceeds the upper limit of (X+3)E18 (however, 0≤X≤3) (atoms/cm$^3$), there may be a leakage issue in the insulating region, and light due to the dopant optical properties may be degraded by absorption.

Next, as shown in FIG. 20, the passivation layer 270 may be disposed on the side and upper surfaces of the mesa-etched light emitting structure and the upper surface of the first reflective layer 220. The passivation layer 270 is also disposed on a side surface of the surface emitting laser device 201 separated by device units, and protects and insulates the surface emitting laser device 201. The passivation layer 270 may be made of an insulating material, for example, a nitride or an oxide. For example, the passivation layer 270 may include at least one of polymide, silica ($SiO_2$), or silicon nitride ($Si_3N_4$).

The passivation layer 270 may partially expose the upper surface of the second reflective layer 250 where the second contact electrode 282 is be formed thereafter.

Next, as shown in FIG. 21, a second contact electrode 282 may be disposed on the second reflective layer 250, where the second reflective layer 250 is exposed in a region between the second contact electrodes 282. The region may correspond to the aperture 241 that is a central region of the above-described aperture region 240. The contact electrode 282 may improve contact characteristics between the second reflective layer 250 and the second electrode 282 to be described later.

Next, a second pad electrode 284 in electrical contact with the exposed second contact electrode 282 may be disposed, and the second pad electrode 284 is disposed to extend above the passivation layer 270. Current can be supplied from the outside. The second contact electrode 282 and the second pad electrode 284 may constitute a second electrode 280.

The second pad electrode 284 may be made of a conductive material, for example, a metal. For example, the second pad electrode 284 includes at least one of aluminum (Al), titanium (Ti), chromium (Cr), nickel (Ni), copper (Cu), and gold (Au) and can be formed into a structure.

In addition, a first electrode 215 may be disposed under the substrate 210. Before the first electrode 215 is disposed, a part of the bottom surface of the substrate 210 may be removed through a predetermined grinding process, so that heat dissipation efficiency may be improved.

The first electrode 215 may be made of a conductive material, for example, a metal. For example, the first electrode 215 includes at least one of aluminum (Al), titanium (Ti), chromium (Cr), nickel (Ni), copper (Cu), and gold (Au) and can be formed into a structure.

The above-described semiconductor device may be a laser diode, and the inside of the two reflective layers may act as resonators. At this time, electrons and holes are supplied to the active layer from the first reflective layer 220 of the first conductivity type and the second reflective layer 250 of the second conductivity type, so that the light emitted from the active region 230 is reflected inside the resonator, and when it amplified and reaches the threshold current, it may be discharged to the outside through the above-described aperture 241.

The light emitted from the semiconductor device according to the embodiment may be light of a single wavelength and a single phase, and the single wavelength region may change depending on the composition of the first reflective layer 220, the second reflective layer 250, and the active region 230.

Next, FIG. 22 is another cross-sectional view of a surface emitting laser device according to an embodiment.

In addition to the vertical type, the surface emitting laser device according to the embodiment may have a flip chip type in which the first electrode 215 and the second electrode 280 have the same direction as shown in FIG. 22.

For example, as shown in FIG. 22, the surface emitting laser device according to another embodiment may include a first electrode 215, a substrate 210, a first reflective layer 220, an active region 230, an aperture region 240, the second reflective layer 250, the second electrode 280, the first passivation layer 271, the second passivation layer 272, and the non-reflective layer 290. In this case, the reflectivity of the second reflective layer 250 may be designed to be higher than that of the first reflective layer 220.

In this case, the first electrode 215 may include a first contact electrode 216 and a first pad electrode 217, and a first contact electrode (eg, a first contact electrode) on the first reflective layer 220 exposed through a predetermined mesa process. The first contact electrode 216 may be electrically connected, and the first pad electrode 217 may be electrically connected to the first contact electrode 216.

The first electrode 215 may be made of a conductive material, for example, a metal. For example, the first electrode 215 includes at least one of aluminum (Al), titanium (Ti), chromium (Cr), nickel (Ni), copper (Cu), and gold (Au) and can be formed into a structure.

When the first reflective layer 220 is a p-type reflective layer, the first electrode 215 may be an electrode for the p-type reflective layer.

Next, the second electrode 280 may include a second contact electrode 282 and a second pad electrode 284, and the second contact electrode 282 is electrically connected to the second reflective layer 250. Then, the second pad electrode 284 may be electrically connected to the second contact electrode 282.

When the second reflective layer 250 is an n-type reflective layer, the second electrode 280 may be an electrode for the n-type reflective layer.

The first insulating layer 271 and the second insulating layer 272 may be made of an insulating material, for example, nitride or oxide, for example, polyimide, silica ($SiO_2$), or it may include at least one of silicon nitride ($Si_3N_4$).

Next, FIG. 23 is a perspective view of a mobile terminal to which a surface light emitting laser device is applied according to an embodiment.

As shown in FIG. 23, the mobile terminal 1500 according to the embodiment may include a camera module 1520, a flash module 1530, and an autofocus device 1510 provided on the rear side. Here, the autofocus device 1510 may include one of the packages of the surface light emitting laser device according to the above-described embodiment as a light emitting unit.

The flash module 1530 may include a light emitting device that emits light therein. The flash module 1530 may be operated by a camera operation of a mobile terminal or a user's control.

The camera module 1520 may include an image capturing function and an auto focus function. For example, the camera module 1520 may include an auto focus function using an image.

The auto focus device 1510 may include an auto focus function using a laser. The auto focus device 1510 may be mainly used in a condition in which an auto focus function using an image of the camera module 1520 is deteriorated, for example, in a proximity or dark environment of 10 m or less. The autofocusing device 1510 may include a light emitting unit including a vertical cavity surface emission laser (VCSEL) semiconductor device, and a light receiving unit that converts light energy such as a photodiode into electrical energy.

Features, structures, effects, and the like described in the above embodiments are included in at least one embodiment, and are not necessarily limited to only one embodiment. Furthermore, the features, structures, effects, and the like illustrated in each embodiment may be combined or modified for other embodiments by a person having ordinary skill in the field to which the embodiments belong. Therefore, contents related to such combinations and modifications should be interpreted as being included in the scope of the embodiments.

Although the embodiments have been described above, these are only examples and are not intended to limit the embodiments, and those of ordinary skill in the field to which the embodiments belong are not departing from the essential characteristics of the embodiments. It will be seen that branch transformation and application are possible. For example, each component specifically shown in the embodiment can be modified and implemented. And differences related to these modifications and applications should be construed as being included in the scope of the embodiments set in the appended claims.

INDUSTRIAL APPLICABILITY

The surface emitting laser device according to the embodiment is used for optical communication, optical parallel processing, optical connection, and the like.

In addition, the surface emitting laser device according to the embodiment may be applied to a high-voltage package for sensors (High Power PKG).

For example, the surface emitting laser device according to the embodiment may be employed in a 3D sensing camera.

For example, the surface emitting laser device according to the embodiment may be applied to a structured light sensor, a time of flight (ToF) sensor, or a laser diode autofocus (LDAF).

The invention claimed is:

1. A surface emitting laser device, comprising:
a substrate;
a first reflective layer disposed on the substrate;
an active layer disposed on the first reflective layer;
an aperture region disposed on the active layer and including an aperture and an insulating region; and
a second reflective layer disposed on the aperture region,
wherein a doping level of the aperture region is $(X+3) \times E18$ (atoms/cm$^3$),
wherein a ratio (b/a) of a second maximum diameter (b) to a first maximum diameter (a) of the aperture is $[95.0-(2X/3)]\%$ to $[99.9-(X/3)]\%$, wherein X is 0 to 3,
wherein the aperture region comprises a delta doped layer disposed between the active layer and the second reflective layer,
wherein the aperture region comprises an insulating region, an aperture, and the delta doped layer, and the delta doped layer is disposed in the aperture.

2. The surface emitting laser device according to claim 1, wherein the first reflective layer, the active layer, and the aperture region are grown and disposed in a predetermined off-angle state of the substrate, and
wherein an off-angle of the substrate is $(X+0.5)°$.

3. The surface emitting laser device according to claim 2, wherein X in the off-angle of the substrate is 0 to 1.5.

4. The surface emitting laser device according to claim 1, wherein the delta doped layer disposed on the second reflective layer, and
wherein the delta doped layer is doped with a second conductivity type dopant.

5. The surface emitting laser device according to claim 4, wherein a dopant concentration in the delta doped layer is higher than a doping level of the aperture region.

6. A light emitting device comprising the surface emitting laser device of claim 1.

7. The surface emitting laser device according to claim 1, wherein an inner end of the insulating region overlaps the delta doped layer in a first direction.

8. The surface emitting laser device according to claim 7, wherein a minimum thickness of the insulating region is in contact with the delta doped layer.

9. The surface emitting laser device according to claim 8, wherein a first thickness of the insulating region at outer region thereof is thicker than a second thickness of the insulating region at inner region thereof adjacent to the aperture.

10. The surface emitting laser device according to claim 9, wherein a dopant concentration of the delta doped layer is higher than that of the second conductivity type dopant of the second reflective layer.

11. A surface emitting laser device, comprising:
a substrate;
a first reflective layer disposed on the substrate;
an active layer disposed on the first reflective layer;
an aperture region disposed on the active layer and including an aperture and an insulating region; and
a second reflective layer disposed on the aperture region,
wherein a doping level of the aperture region is $(X+3) \times E18$ (atoms/cm$^3$), and X is 0 to 3,
wherein the aperture region comprises a delta doped layer disposed between the active layer and the second reflective layer, and
wherein the aperture region comprises an insulating region, an aperture, and the delta doped layer, and the delta doped layer is disposed in the aperture.

12. The surface emitting laser device according to claim 11, wherein a ratio (b/a) of a second maximum diameter (b) to a first maximum diameter (a) of the aperture is $[95.0-(2X/3)]\%$ to $[99.9-(X/3)]\%$.

13. The surface emitting laser device according to claim 11, wherein a dopant concentration in the delta doped layer is higher than a doping level of the aperture region.

14. The surface emitting laser device according to claim 11, wherein the first reflective layer, the active layer, and the aperture region are grown in a predetermined off-angle state, and an off-angle of the substrate is $(X+0.5)°$.

15. The surface emitting laser device according to claim 11, wherein an inner end of the insulating region overlaps the delta doped layer in a first direction.

16. The surface emitting laser device according to claim 15, wherein a minimum thickness of the insulating region is in contact with the delta doped layer, and
wherein a first thickness of the insulating region at outer region thereof is thicker than a second thickness of the insulating region at inner region thereof adjacent to the aperture.

17. A light emitting device comprising the surface emitting laser device of claim 11.

* * * * *